(12) United States Patent (10) Patent No.: US 7,994,850 B2
Burke (45) Date of Patent: Aug. 9, 2011

(54) DISCRETE TIME MULTI-RATE ANALOG FILTER

(75) Inventor: Joseph Patrick Burke, Glenview, IL (US)

(73) Assignee: QUALCOMM, Incorporated, San Diego, CA (US)

( * ) Notice: Subject to any disclaimer, the term of this patent is extended or adjusted under 35 U.S.C. 154(b) by 82 days.

(21) Appl. No.: 12/146,376

(22) Filed: Jun. 25, 2008

(65) Prior Publication Data

US 2009/0322418 A1 Dec. 31, 2009

(51) Int. Cl.
*H03B 1/00* (2006.01)
(52) U.S. Cl. ....................................... 327/554
(58) Field of Classification Search .................. 327/551, 327/552, 553, 554
See application file for complete search history.

(56) References Cited

U.S. PATENT DOCUMENTS

| | | | | |
|---|---|---|---|---|
| 6,300,823 B1 * | 10/2001 | Zhou et al. | ...................... | 327/551 |
| 6,438,366 B1 * | 8/2002 | Lindfors et al. | ............. | 455/334 |
| 6,791,399 B2 * | 9/2004 | Jaussi et al. | ..................... | 327/553 |
| 7,079,826 B2 | 7/2006 | Muhammad et al. | | |
| 7,356,069 B2 * | 4/2008 | Muhammad et al. | ......... | 375/140 |
| 7,411,444 B2 * | 8/2008 | Muhammad et al. | ......... | 327/552 |
| 7,423,458 B2 * | 9/2008 | Aghtar | ............................. | 327/91 |
| 7,539,721 B2 * | 5/2009 | Belveze et al. | ............... | 708/819 |
| 7,602,862 B2 * | 10/2009 | May et al. | ..................... | 375/322 |
| 2003/0083033 A1 | 5/2003 | Staszewski et al. | | |

FOREIGN PATENT DOCUMENTS

EP 1646147 4/2006
WO WO08032635 3/2008

OTHER PUBLICATIONS

Dias V., F., et al. "Programmable Fir Switched-Capacitor Decimators", IEEE C International Symposium on Circuits and Systems 1991 IEEE C International Symposium on Circuits and Systems, Nov. 7, 1991 ,pp. 1685-1688.
International Search Report - PCT/US2009/048716, International Search Authority - European Patent Office - Nov. 3, 2009.
Written Opinion - PCT/US2009/048716, International Search Authority, European Patent Office, Nov. 3, 2009.

* cited by examiner

*Primary Examiner* — Jeffrey S Zweizig
(74) *Attorney, Agent, or Firm* — Ramin Mobarhan

(57) ABSTRACT

A discrete time analog filter suitable for use in a receiver and other electronics devices is described herein. In one exemplary design, an apparatus may include a transconductance amplifier, a sampler, and a discrete time analog filter. The transconductance amplifier may amplify a voltage input signal and provide an analog signal. The sampler may sample the analog signal and provide analog samples at a sampling rate. The discrete time analog filter may filter the analog samples and provide filtered analog samples either at the sampling rate for a non-decimating filter or at an output rate that is lower than the sampling rate for a decimating filter. The discrete time analog filter may also filter the analog samples with either equal weights for a rectangular filter or at least two different weights for a weighted filter.

34 Claims, 13 Drawing Sheets

US 7,994,850 B2

DISCRETE TIME MULTI-RATE ANALOG FILTER

BACKGROUND

I. Field

The present disclosure relates generally to electronics circuits, and more specifically to techniques for processing an analog signal.

II. Background

In a wireless communication system, a transmitter may digitally process (e.g., encode and modulate) digital data to generate output chips. The transmitter may further condition (e.g., convert to analog, amplify, filter, and frequency upconvert) the output chips to generate a radio frequency (RF) modulated signal. The transmitter may then transmit the RF modulated signal via a wireless channel to a receiver.

The receiver may receive the transmitted RF signal and perform complementary processing on the received RF signal. The receiver may condition (e.g., amplify, filter, frequency downconvert, and digitize) the received RF signal to obtain digital samples. The receiver may further process (e.g., demodulate and decode) the digital samples to recover the transmitted data.

The receiver may employ various analog circuits such as amplifiers, mixers, and filters in a receive path to process the received RF signal. The receiver may support multiple radio technologies and/or multiple frequency bands and may have different receive paths for different radio technologies and/or different frequency bands. The analog circuits add to the cost of the receiver and further consume battery power. There is therefore a need in the art for techniques to efficiently process the received RF signal.

DETAILED DESCRIPTION

Figure 1:
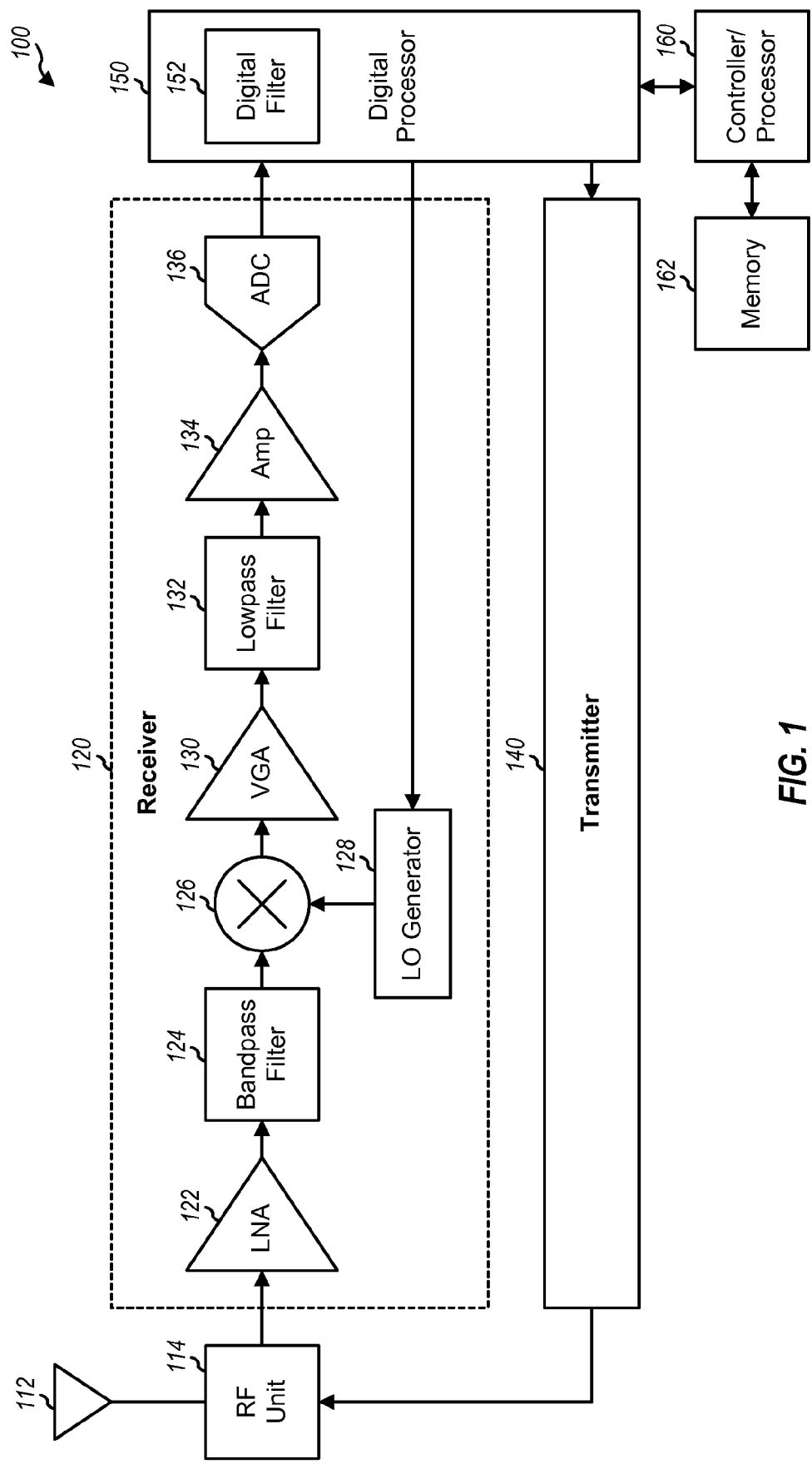
FIG. 1 shows a block diagram of a wireless communication device.

The detailed description set forth below in connection with the appended drawings is intended as a description of exemplary designs of the present disclosure and is not intended to represent the only designs in which the present disclosure can be practiced. The term "exemplary" used throughout this description means "serving as an example, instance, or illustration," and should not necessarily be construed as preferred or advantageous over other exemplary design. The detailed description includes specific details for the purpose of providing a thorough understanding of the exemplary designs of the disclosure. It will be apparent to those skilled in the art that the exemplary designs of the disclosure may be practiced without these specific details. In some instances, well-known structures and devices are shown in block diagram form in order to avoid obscuring the novelty of the exemplary designs presented herein.

Techniques for efficiently processing an analog signal (e.g., for a received RF signal) are described herein. In one exemplary design, an apparatus may include a transconductance amplifier or an input capacitor, a sampler, and a discrete time analog filter. The transconductance amplifier may amplify a voltage input signal (e.g., a received RF signal) and provide an analog signal. Alternatively, the input capacitor may provide the analog signal. The sampler may sample the analog signal and provide analog samples at a sampling rate. An analog sample is an analog value for a discrete time instant. An analog sample may have any value whereas a digital sample may be restricted to certain quantized values. The discrete time analog filter may filter the analog samples and provide filtered analog samples either at the sampling rate for a non-decimating filter or at an output rate that is lower than the sampling rate for a decimating filter. The discrete time analog filter may also filter the analog samples with either equal weights for a rectangular filter or different weights for a weighted filter.

In one exemplary design, the discrete time analog filter may be operated in one of multiple modes, which may include a decimating rectangular mode, a decimating weighted mode, a non-decimating rectangular mode, and/or a non-decimating weighted mode. The discrete time analog filter may include a number of capacitors that may be charged based on first control signals and coupled to a summing node based on second control signals. A control signal generator may generate the first and second control signals based on a selected mode. The discrete time analog filter may then filter the analog samples based on the selected mode to obtain the filtered analog samples.

In one exemplary design, the discrete time analog filter may include multiple sections for multiple filter taps, and each section may include multiple capacitors. For a non-decimating filter, N+1 sections may be used for an N-tap filter and may be charged in N+1 sample periods, one section in each sample period. All of the capacitors in a section may be charged to the same value in one sample period. For each section not being charged, the multiple capacitors in that section may be coupled to the summing node in multiple sample periods, one capacitor in each sample period.

For a decimating weighted filter, N sections may be used for an N-tap filter, the capacitors in each section may have equal size, and the weight for each filter tap may be determined based on the number of selected capacitors in the section. The N sections may be charged in N sample periods, one section in each sample period. For each section, all of the capacitors may be charged in one sample period, and unselected capacitors may thereafter be discharged. After all N sections have been charged, all of the charged and discharged capacitors in the N sections may be coupled to the summing node.

The discrete time analog filter described herein may be used for various applications such as wireless communication, computing, networking, consumer electronics, etc. The discrete time analog filter may also be used for various devices such as wireless communication devices, cellular phones, broadcast receivers, personal digital assistants (PDAs), handheld devices, wireless modems, laptop computers, cordless phones, Bluetooth devices, consumer electronics devices, etc. For clarity, the use of the discrete time analog filter in a wireless communication device, which may be a cellular phone or some other device, is described below.

FIG. 1 shows a block diagram of an exemplary design of a wireless communication device 100. In this exemplary design, wireless device 100 includes a receiver 120 and a transmitter 140 that support bi-directional communication.

On the receive path, an antenna 112 receives RF modulated signals transmitted by base stations and provides a received RF signal, which is routed through an RF unit 114 and provided to receiver 120. RF unit 114 may include an RF switch and/or a duplexer that can multiplex RF signals for the transmit and receive paths. Within receiver 120, the received RF signal is amplified by a low noise amplifier (LNA) 122, filtered by a bandpass filter 124, and downconverted from RF to baseband by a mixer 126. A local oscillator (LO) generator 128 generates an LO signal used for frequency downconversion and provides the LO signal to mixer 126. The downconverted signal from mixer 126 is amplified by a variable gain amplifier (VGA) 130, filtered by a lowpass filter 132, amplified by an amplifier (Amp) 134, and digitized by an analog-to-digital converter (ADC) 136 to obtain digital samples, which are provided to a digital processor 150. The digital samples may be processed by a digital filter 152 and/or other processing units within digital processor 150.

On the transmit path, digital processor 150 processes data to be transmitted and provides output chips to transmitter 140. Transmitter 140 processes (e.g., converts to analog, filters, amplifies, and frequency upconverts) the output chips to generate an output RF signal, which is routed through RF unit 114 and transmitted via antenna 112. For simplicity, details of transmitter 140 are not shown in FIG. 1.

FIG. 1 shows an exemplary receiver design using a direct-conversion architecture, which frequency downconverts a signal from RF directly to baseband in one stage. FIG. 1 also shows the use of various analog circuit blocks such as LNA 122 and mixer 126 in receiver 120. In general, it is desirable to simplify the design of the receiver in order to reduce cost, size, power consumption, etc.

Analog circuit blocks are commonly fabricated in complementary metal oxide semiconductor (CMOS) in order to obtain various benefits such as lower cost, smaller size, etc. CMOS fabrication technology continually improves and transistor size continually shrinks. This allows higher clock speed to be used for smaller and faster transistors. The trend of higher clock speeds for smaller CMOS transistor sizes means that some traditional analog circuit blocks and functions may be more efficiently implemented with circuit blocks and functions that are more digital in nature. It is anticipated that usable digital logic and circuitry will support clock speeds equal to Nyquist rate (or twice the RF center frequency) in the near future for commonly used frequency bands from 800 MHz to 2.4 GHz. A discrete-time radio architecture can take advantage of the fine time resolution offered by the higher clock speeds of sub-micron CMOS processes in order to reduce receiver complexity, cost, size, and power consumption.

Figure 2:
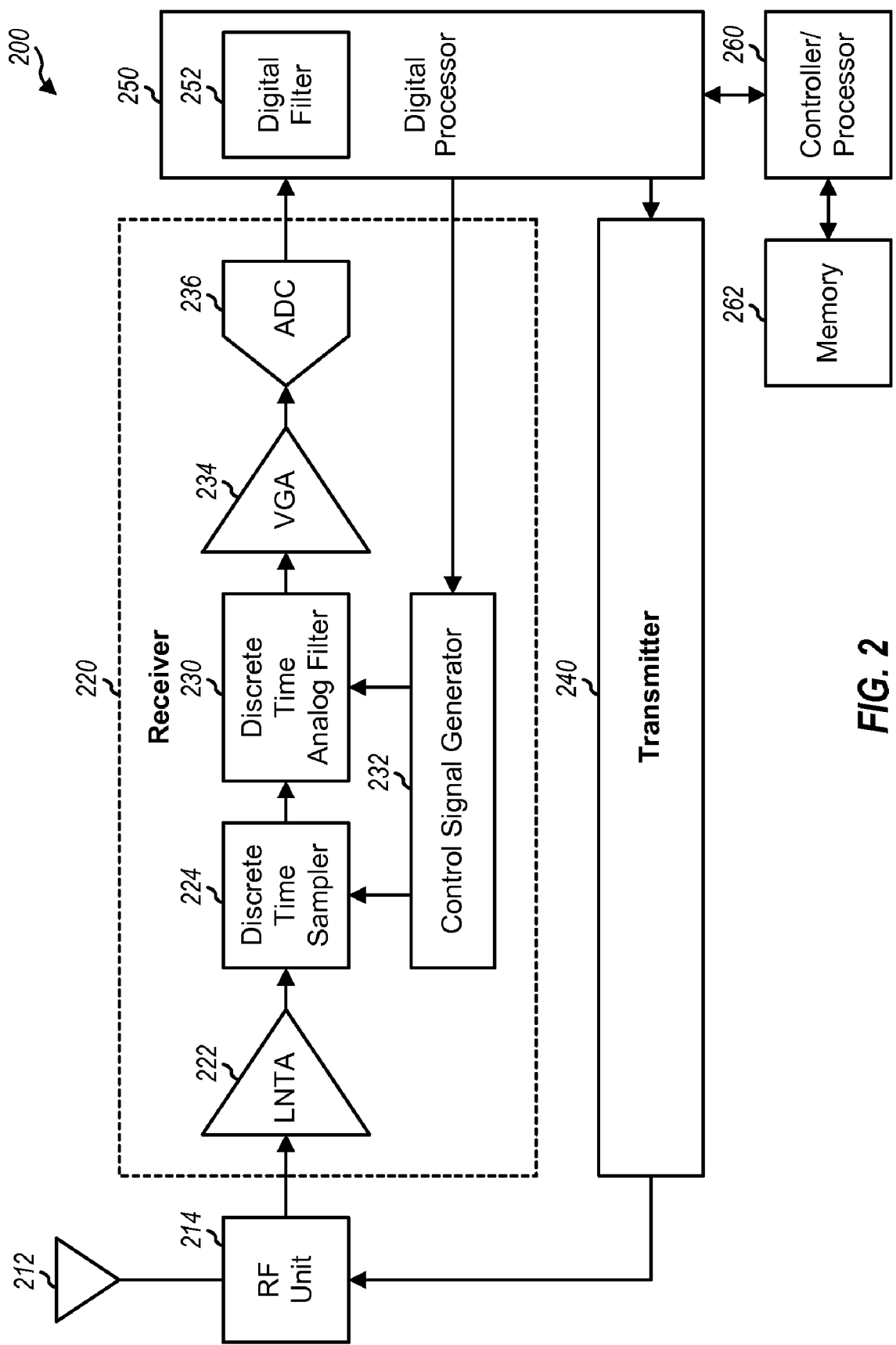
FIG. 2 shows a block diagram of a wireless communication device with a discrete time radio architecture.

FIG. 2 shows a block diagram of an exemplary design of a wireless communication device 200 with a discrete time radio architecture. In this exemplary design, wireless device 200 includes a receiver 220 and a transmitter 240 that support bi-directional communication. In general, wireless device 200 may include any number of receivers and any number of transmitters for any number of communication systems and frequency bands.

On the receive path, an antenna 212 receives RF modulated signals transmitted by base stations and provides a received RF signal, which is routed through an RF unit 214 and provided to receiver 220. Within receiver 220, a low noise transconductance amplifier (LNTA) 222 amplifies the received RF signal (which is a voltage signal) and provides an amplified RF signal (which is a current signal). A discrete time sampler 224 samples the amplified RF signal and provides analog samples. A discrete time analog filter 230 filters the analog samples and provides filtered analog samples. The filtered analog samples are amplified by a VGA 234 and digitized by an ADC 236 to obtain digital samples, which are provided to a digital processor 250. The digital samples may be processed by a digital filter 252 and/or other processing units within digital processor 250. A control signal generator 232 generates a sampling clock for sampler 224 and control signals for discrete time analog filter 230.

On the transmit path, transmitter 240 processes output chips from digital processor 250 and provides an output RF signal, which is routed through RF unit 214 and transmitted via antenna 212. For simplicity, details of transmitter 240 are not shown in FIG. 2.

Digital processor 250 may include various processing units for data transmission and reception and other functions. For example, digital processor 250 may include a digital signal processor (DSP), a reduced instruction set computer (RISC) processor, a central processing unit (CPU), etc. A controller/processor 260 may control the operation at wireless device 100. A memory 262 may store program codes and data for wireless device 200. Data processor 250, controller/processor 260, and/or memory 262 may be implemented on one or more application specific integrated circuits (ASICs) and/or other ICs.

FIG. 2 shows an exemplary design of receiver 220. In general, the conditioning of the signals within receiver 220 may be performed by one or more stages of amplifier, filter, etc. These circuit blocks may be arranged differently from the configuration shown in FIG. 2. Furthermore, other circuit blocks not shown in FIG. 2 may also be used to condition the signals in the receiver. For example, a lowpass filter may be added before or after VGA 234. As another example, multiple stages of VGA and a lowpass filter may be located between discrete time analog filter 230 and ADC 236. Some circuit blocks in FIG. 2 may also be omitted. For example, VGA 234 may be omitted or replaced with a buffer. All or a portion of receiver 220 may be implemented on one or more RF integrated circuits (RFICs), mixed-signal ICs, etc.

Figure 3A:
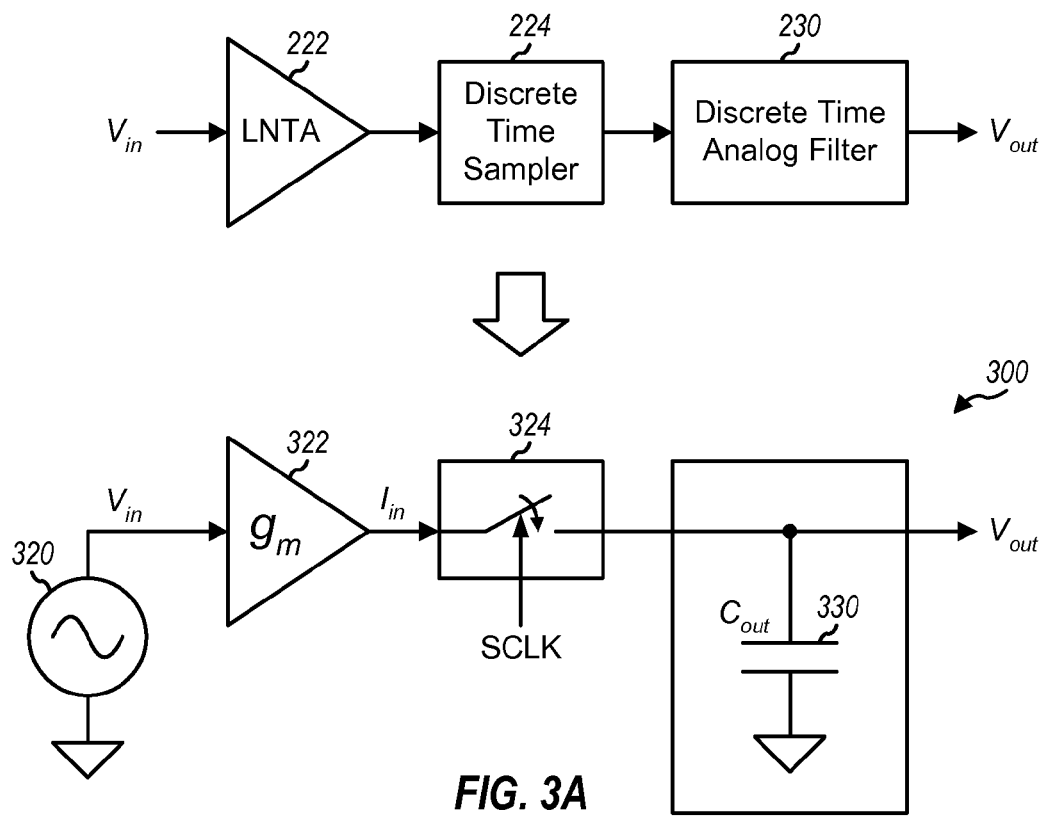
FIG. 3A shows a discrete time charge sampler.

FIG. 3A shows a discrete time charge sampler 300, which is a model of a portion of receiver 220 in FIG. 2. In discrete time charge sampler 300, a signal source 320 provides an input signal $V_{in}$, a transconductance amplifier 322 models LNTA 222, a switch 324 models discrete time sampler 224, and a capacitor 330 models discrete time analog filter 230. Transconductance amplifier 322 amplifies the input signal $V_{in}$ and provides a current signal $I_{in}$. Switch 324 is controlled by a sampling clock (SCLK) having a rate of $f_s$. The sampling rate $f_s$ may be any suitable rate and may be selected based on the application and/or frequency band being supported. Capacitor 330 is used to illustrate the sampling characteristics of receiver 220 and provides an output signal $V_{out}$.

Figure 3C:
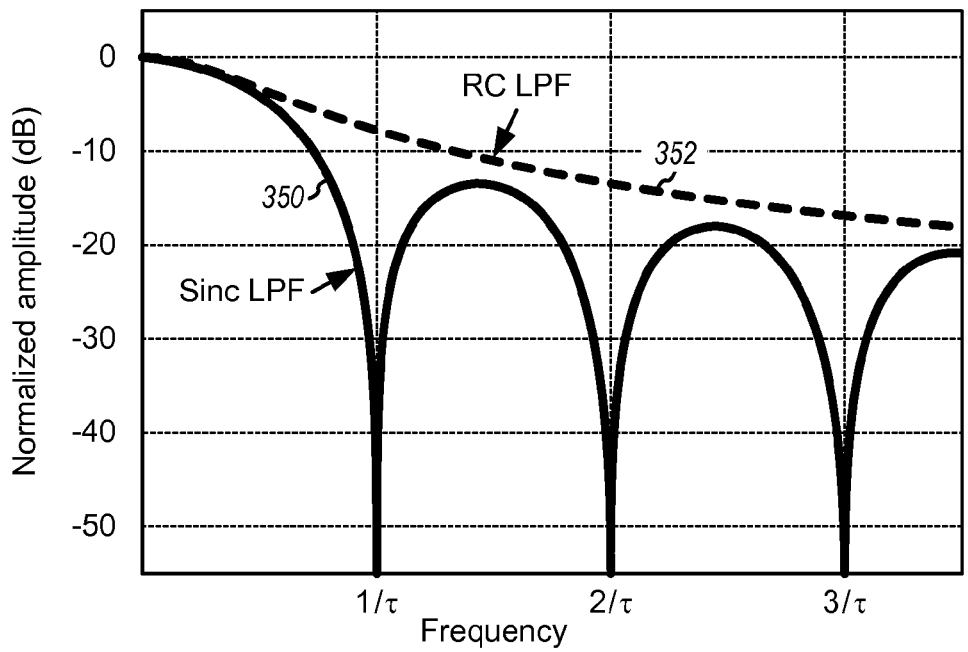
FIG. 3C shows frequency response of the discrete time charge sampler.
Figure 3B:
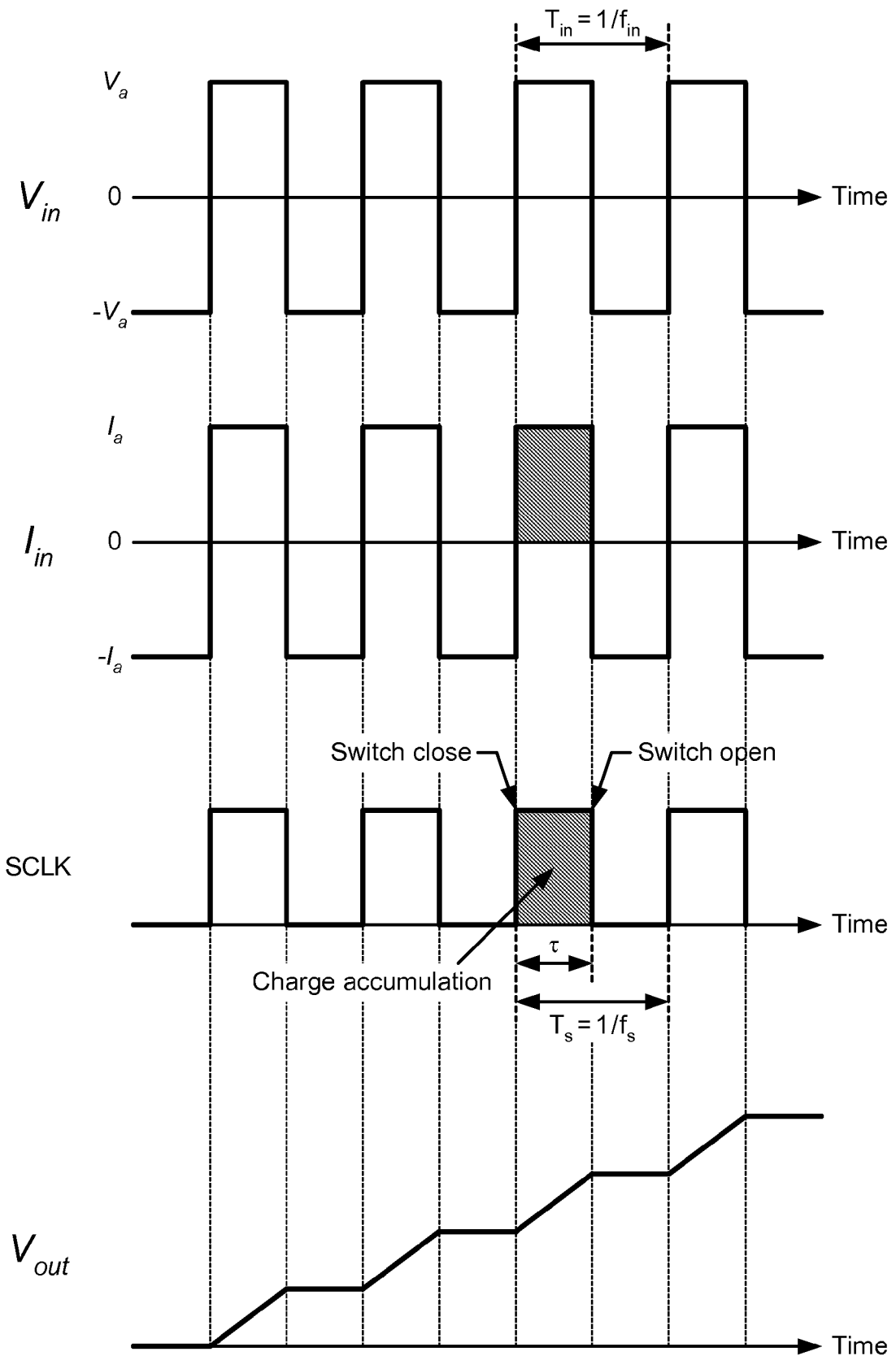
FIG. 3B shows operation of the discrete time charge sampler.

FIG. 3B shows the operation of discrete time charge sampler 300 in FIG. 3A. In the example shown in FIG. 3B, the input signal $V_{in}$ is a square wave signal transitioning between voltages of $V_a$ and $-V_a$ at a rate of $f_{in}$, e.g., $f_{in}=1$ GHz and $V_a$=10 mV. The current signal $I_{in}$ is also a square wave signal transitioning between currents of $I_a$ and $-I_a$ at the rate of $f_{in}$, where $I_a$ is dependent on $V_a$ as well as the transconductance $g_m$ of amplifier 322, e.g., $g_m$=0.1 and $I_a$=1 mA. In this example, the sampling clock SCLK is at the same rate as the input signal, or $f_s=f_{in}$, and is further aligned with the positive pulses of the current signal $I_{in}$. When switch 324 is closed by the leading edge of the sampling clock, the current signal $I_{in}$ charges capacitor 330, and the output signal $V_{out}$ increases at a rate that is determined based on the current $I_a$ and the capacitor size $C_{out}$. For example, if $I_a$=1 mA, $C_{out}$=20 pF, and τ=0.5 ns, then the output signal $V_{out}$ increases 25 mV in each sampling clock period, where τ is the "on" duration of the sampling clock. The terms "clock period", "sample period", and "clock cycle" are used interchangeably herein. The output signal $V_{out}$ is maintained while switch 324 is closed. An analog sample may be defined as the value of the output signal $V_{out}$ whenever switch 324 is opened.

As shown in FIG. 3B, periodically closing and opening switch 324 results in the mixing of the input signal $V_{in}$ with the sampling clock SCLK. This mixing may be used for frequency downconversion. The integration function from time t=0 to τ in each sampling clock period creates a sin (x)/x lowpass filter response in the frequency domain for the analog samples.

FIG. 3C shows a sinc (x)=sin (x)/x frequency response 350 of discrete time charge sampler 300 in FIG. 3A, where x=π·τ·f. The sinc (x) frequency response has zeros located at integer multiples of $f_{zero}$=1/τ for a square wave sampling clock. The zeros are obtained with discrete time charge sampling and are beneficial for subsequent signal processing. In particular, the analog samples from discrete time charge sampler 300 may be subsequently downsampled or subsampled, which would then alias high frequency spectrum to low frequency spectrum. The zeros would then fold/fall back at baseband, resulting in no noise or reduced noise aliasing at the frequencies of the zeros. For a discrete time voltage sampler, the zeros are not present, and aliased noise from downsampling may be worse than for the discrete time current sampler. FIG. 3C also shows a first-order RC lowpass filter response 352 obtained with switch 324 being closed.

For simplicity, FIG. 3A shows the use of a single capacitor 330 for discrete time analog filter 230. In general, discrete time analog filter 230 may implement any type of filter such as a finite impulse response (FIR) filter, an infinite impulse response (IIR) filter, an auto regressive moving average (ARMA) filter composed of both FIR and IIR filter sections, etc. Discrete time analog filter 230 may be designed to provide various functions such as (i) frequency selectivity to recover a desired signal, which may have a variable bandwidth, (ii) reduced noise aliasing during clock rate decimation from $f_s$ down to a lower rate, (iii) rejection of undesired spectral components such as images, spurs and jammers, and/or (iv) other functions. Discrete time analog filter 230 may also be designed as an adaptive filter that can provide variable bandwidth selectivity and filtering. Some exemplary designs of discrete time analog filter 230 are described below.

Figure 4:
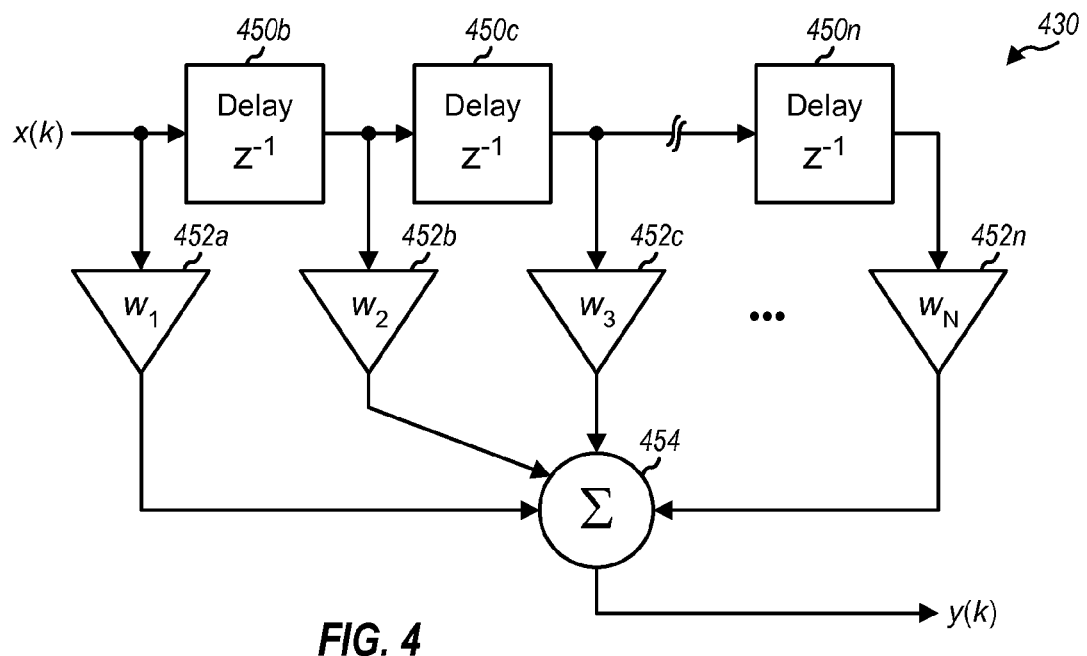
FIG. 4 shows an N-tap finite impulse response (FIR) filter.

FIG. 4 shows an exemplary design of an N-tap FIR filter 430 that may be implemented by discrete time analog filter 230. FIR filter 430 includes N−1 delay elements 450b through 450n that are coupled in series, with delay element 450b receiving input samples x(k). Each delay element 450 provides a delay of one sampling clock period. A gain element 452a is coupled to the input of delay element 450b, and N−1 gain elements 452b through 452n are coupled to the outputs of N−1 delay elements 450b through 450n, respectively. Gain elements 452a through 452n have weights of $w_1$ through $w_N$, respectively. A summer 454 is coupled to the outputs of all N gain elements 452a through 452n and provides output samples y(k).

The output samples y(k) from FIR filter 430 may be expressed as:

$$y(k) = \sum_{n=1}^{N} w_n \cdot x(k-n-1), \quad \text{Eq (1)}$$

where $w_n$ is the weight for the n-th filter tap. In equation (1), x(k−n−1) and not x(k−n) is used because index n starts at 1 instead of 0.

FIR filter 430 may be operated as either a decimating or non-decimating filter. Additionally, FIR filter 430 may be operated as either a rectangular filter or a weighted filter. Table 1 provides a short description for each mode.

TABLE 1

| Mode | Description |
| --- | --- |
| Decimating | One output sample y(k) is obtained every M clock periods, where M is the decimation rate. |
| Non-decimating | One output sample y(k) is obtained every clock period. |
| Rectangular | Weights $w_1$ through $w_N$ are equal, or $w_1 = w_2 = \ldots = w_N$. |
| Weighted | Weights $w_1$ through $w_N$ may have different values. |

For a decimating rectangular FIR filter, the N weights are equal, and one output sample y(k) is obtained every M clock periods. The input samples x(k) are at the sampling rate $f_s$, and the output samples y(k) are at an output rate of $f_{out}=f_s/M$. In general, the decimation rate M may or may not be equal to the number of taps N. The FIR filter response is determined by the N equal weights and has a sinc (x) frequency response. The decimation by M results in the spectrum of the input samples being folded such that components at integer multiples of $f_{out}$ are folded to baseband.

For a non-decimating rectangular FIR filter, the N weights are equal, and one output sample y(k) is obtained every clock period. The input samples x(k) are at the sampling rate $f_s$, and the output samples y(k) are also at the sampling rate, or $f_{out}=f_s$. Hence, the spectrum of the input samples is not folded. The FIR filter has a sinc (x) frequency response due to the equal weights.

For a decimating weighted FIR filter, the N weights may be different, and one output sample y(k) is obtained every M clock periods. The FIR filter response is determined by the values of the N weights, which may be selected to obtain a desired frequency response for the FIR filter. For example, the FIR filter response may be selected to attenuate out-of-band components, which may reduce inband noise after decimation. For a weighted FIR filter, the weights may be selected to implement any type of filter such as a Hanning filter, a Hamming filter, a Gaussian filter, Chebyshev filter, a Bessel filter, etc. These various types of filter are known in the art.

For a non-decimating weighted FIR filter, the N weights may be different, and one output sample y(k) is obtained every clock period. The N weights may be selected to obtain the desired frequency response for the FIR filter.

Figure 5A:
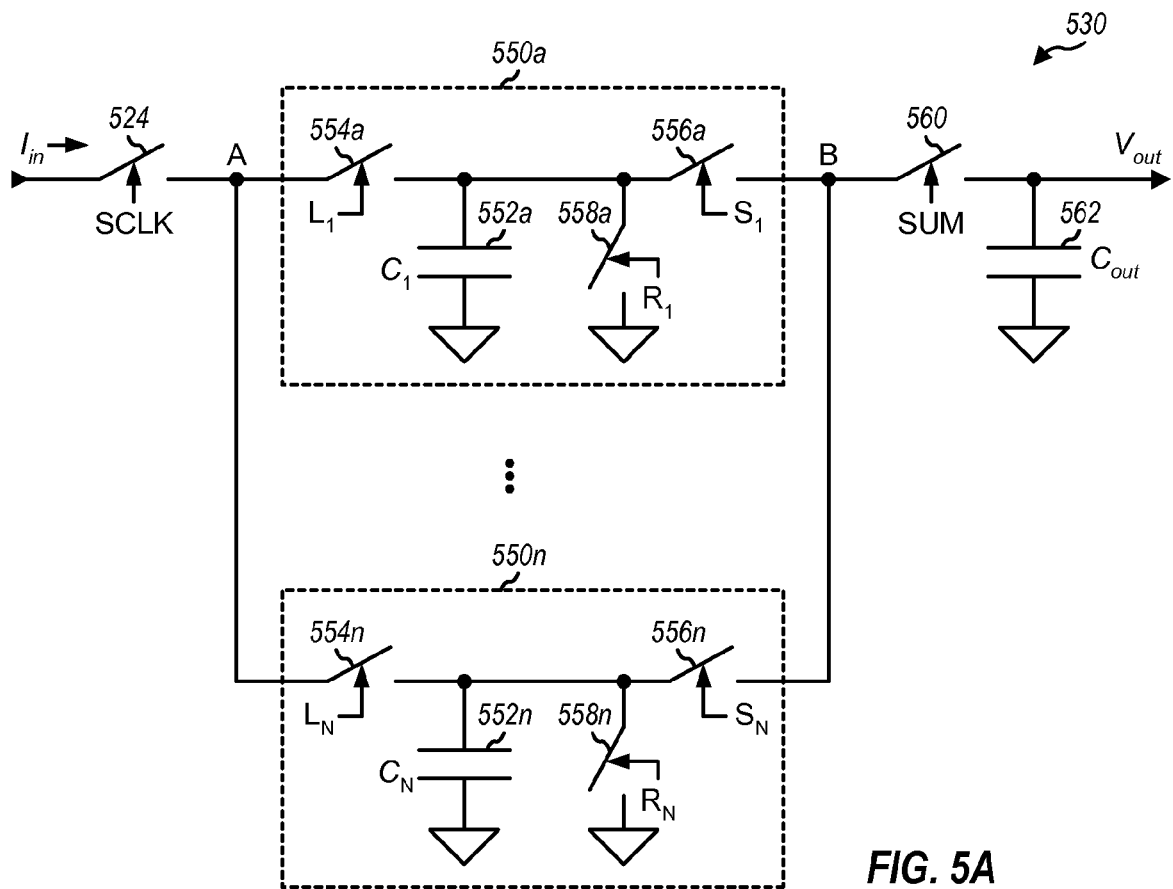
FIG. 5A shows a decimating N-tap analog FIR filter.

FIG. 5A shows a schematic diagram of a decimating N-tap analog FIR filter 530, which is one exemplary design of FIR filter 430 using switched capacitors. A sampling switch 524 has one end receiving a current signal $I_{in}$ and the other end coupled to an input node A. The current signal $I_{in}$ may be provided by a transconductance amplifier (e.g., LNTA 222 in FIG. 2), an input capacitor, or some other current source. An input capacitor may be used to provide the input current or charge when multiple FIR filter stages are coupled in series. The signal at node A may correspond to x(k) in FIG. 4.

Analog FIR filter 530 includes N cells 550a through 550n and an output circuit composed of a pass switch 560 and a capacitor 562. Each cell 550 includes a capacitor 552, a charge switch 554, a select switch 556, and a reset switch 558. Switch 554 has one end coupled to node A (which is the cell input) and the other end coupled to a first end of capacitor 552. A second end of capacitor 552 is coupled to circuit ground. Switch 556 has one end coupled to the first end of capacitor 552 and the other end coupled to a summing node B (which is the cell output). Switch 558 has one end coupled to the first end of capacitor 552 and the other end coupled to circuit ground. Switch 558 is used to reset capacitor 552 to a predetermined value prior to each charging operation and is controlled by a reset signal $R_n$, where $n \in \{1, \ldots, N\}$. The predetermined value may be circuit ground (as shown in FIG. 5A) or a common mode DC voltage that may be selected to provide proper DC biasing for CMOS switches. Switch 554 is used to charge capacitor 552 and is controlled by a load signal $L_n$. Capacitor 552 stores the charge from the current signal $I_{in}$ and implements one delay element 450 in FIG. 4. Switch 554 is used to couple capacitor 552 to node B and is controlled by a select signal $S_n$.

Switch 560 has one end coupled to node B and the other end coupled to a first end of capacitor 562. A second end of capacitor 562 is coupled to circuit ground. The signal at the first end of capacitor 562 may correspond to y(k) in FIG. 4. Switch 560 is used to pass the current from summing node B to capacitor 562 and is controlled by a sum control signal SUM.

Analog FIR filter 530 operates as follow. Switches 558a through 558n may be closed by enabling reset signals $R_1$ through $R_N$, respectively, to reset capacitors 552a through 552n, respectively, to a predetermined value (e.g., 0V). Switch 524 is controlled by the sampling clock SCLK and provides the input current $I_{in}$ to node A whenever switch 524 is closed. In each clock period, one of the N switches 554a through 554n is closed, and the current on node A charges the capacitor 552 coupled to the closed switch. Capacitors 552a through 552n may be charged in N consecutive clock periods, one capacitor per clock period, by enabling one load signal $L_n$ in each clock period. After all N capacitors 552a through 552n have been charged, switches 556a through 556n are closed by enabling all N select signals $S_1$ through $S_N$, and switch 560 is closed by enabling the SUM signal. The charges on capacitors 552a through 552n are then transferred to capacitor 562. Node B is a current summing node that sums the currents from all N capacitors 552a through 552n and may correspond to summer 454 in FIG. 4.

Figure 5B:
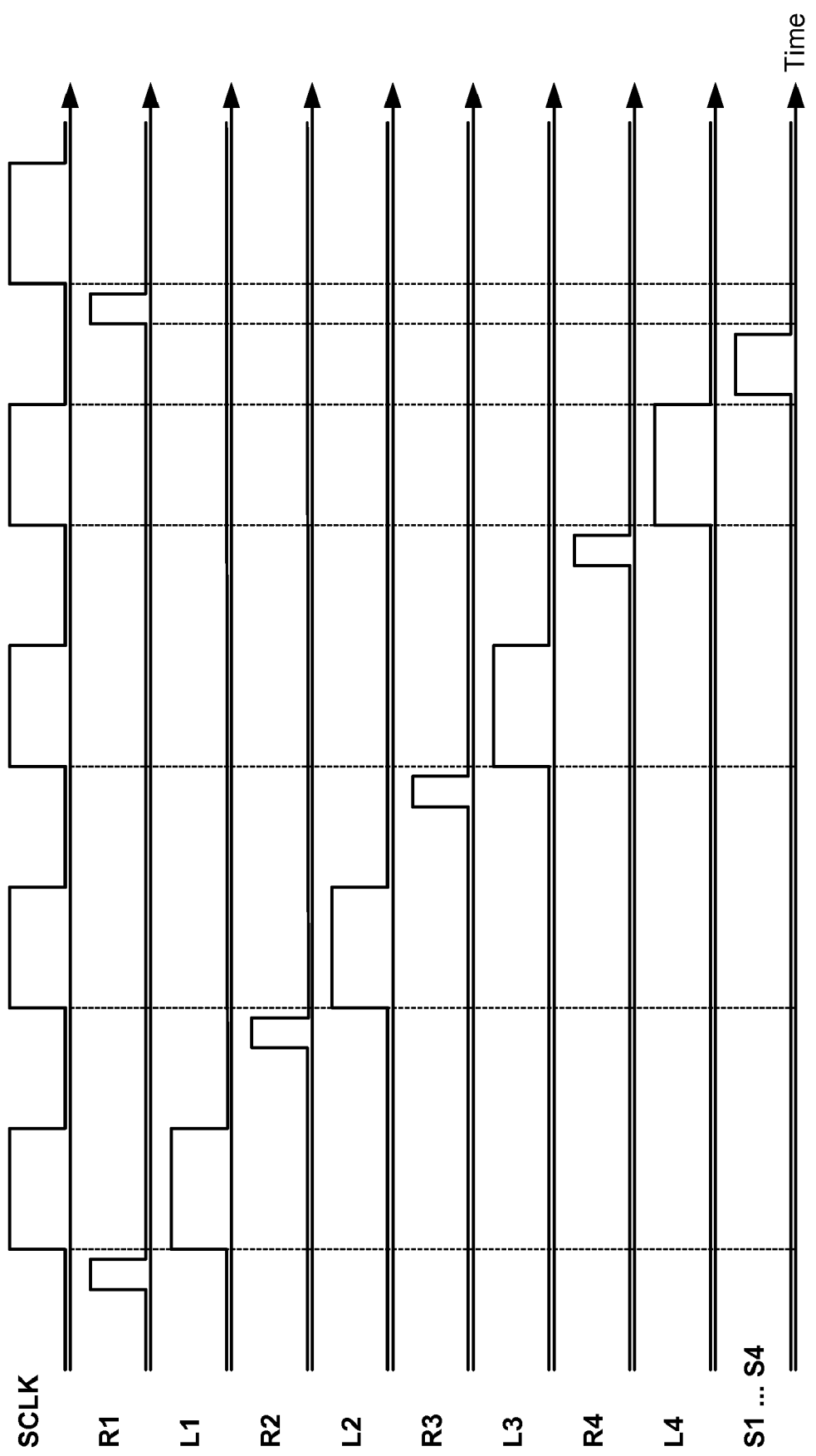
FIG. 5B shows a timing diagram of control signals for the analog FIR filter in FIG. 5A.

FIG. 5B shows a timing diagram of various control signals for analog FIR filter 530 for an example with N=4 cells. Each capacitor 552 may be reset to a predetermined value prior to being charged by enabling the reset signal $R_n$ for that capacitor. The four capacitors may be reset at different times (as shown in FIG. 5B) or the same time (not shown in FIG. 5B). Each capacitor 552 may be charged by the input current $I_{in}$ based on the load signal $L_n$ for that capacitor. All four capacitors may transfer their charges to capacitor 562 based on their select signals $S_1$ through $S_4$.

Each cell 550 provides storage for one analog sample and implements one delay element 450 in FIG. 4. The amount of delay provided by each cell is determined by the timing of the load signal $L_n$ for that cell. Each cell 550 has a weight $w_n$ determined by the size of capacitor 552 for that cell, as follows:

$$w_n = \frac{C_n}{C_{total} + C_{out}}, \quad \text{Eq (2)}$$

where $$C_{total} = \sum_{n=1}^{N} C_n.$$

Equation (2) indicates that the weight for each filter tap may be selected based on the size of capacitor 552 for that filter tap.

Analog FIR filter 530 charges the N capacitors 552a through 552n in N clock periods, and the charges on these capacitors are then transferred to capacitor 562. The voltage on capacitor 562 may be expressed as:

$$\frac{V_{out}}{V_{in}} = \frac{C_{total}}{C_{total} + C_{out}}. \quad \text{Eq (3)}$$

Each capacitor 552 may be used to charge capacitor 562 only once, after which the voltage on capacitor 552 may be different from the original value because of the charge sharing. Analog FIR filter 530 can thus provide one output sample in every N clock periods, and the decimation rate is N.

Figure 6:
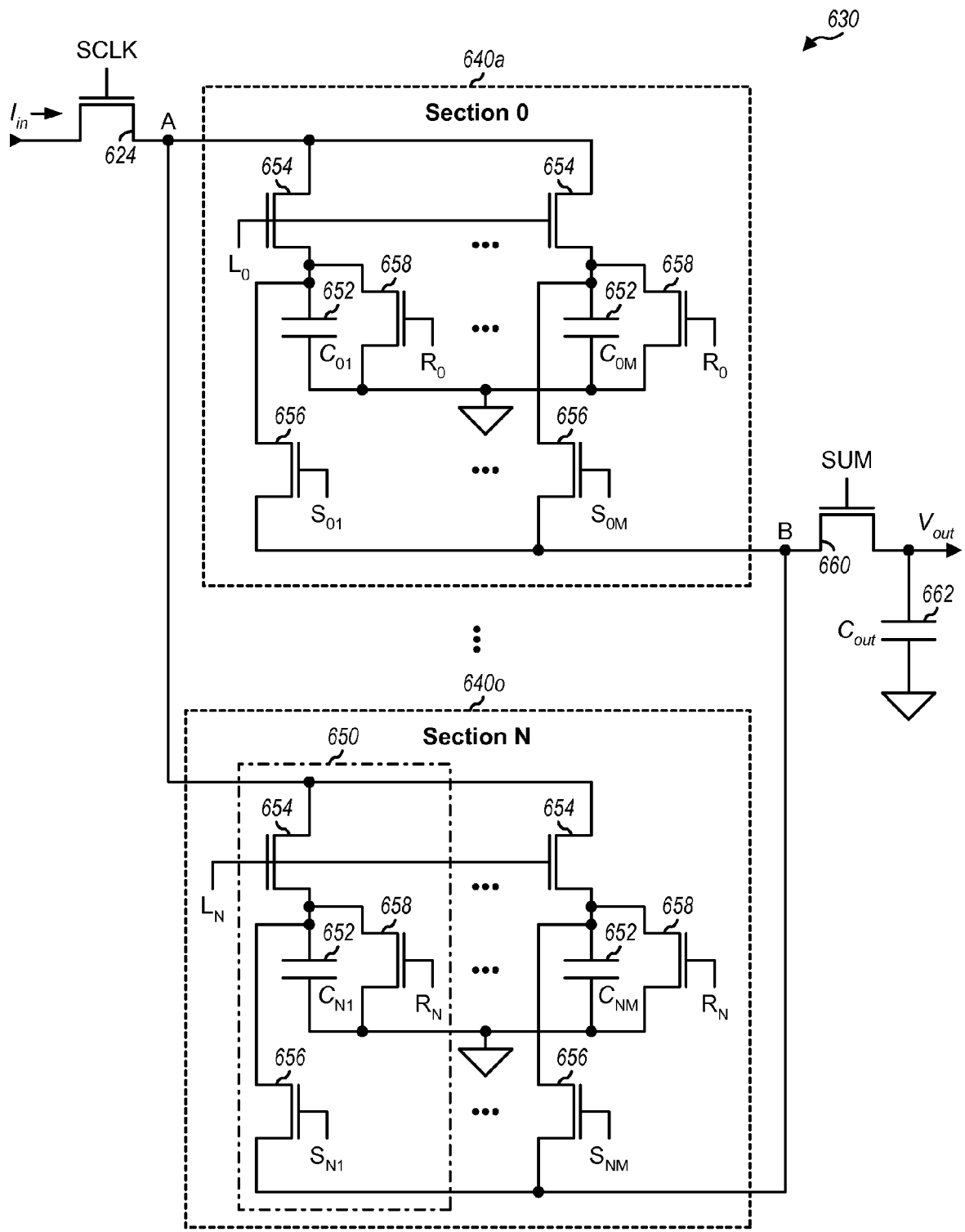
FIG. 6 shows a non-decimating N-tap analog FIR filter.

FIG. 6 shows a schematic diagram of an exemplary design of an N-tap analog FIR filter 630, which implements FIR filter 430 using switched capacitors. Analog FIR filter 630 may be used for discrete time analog filter 230 in FIG. 2. An N-channel metal oxide semiconductor (NMOS) transistor 624 has its source receiving a current signal $I_{in}$, its gate receiving the sampling clock SCLK, and its drain coupled to node A. The current signal $I_{in}$ may be provided by a transconductance amplifier (e.g., LNTA 222 in FIG. 2), an input capacitor, or some other current source. NMOS transistor 624 may be used for discrete time sampler 224 in FIG. 2 and correspond to sampling switch 524 in FIG. 5A.

Analog FIR filter 630 includes N+1 sections 640a through 640o and an output circuit composed of an NMOS transistor 660 and a capacitor 662. Each section 640 has its input coupled to node A and its output coupled to summing node B. NMOS transistor 660 operates as a pass switch and has its source coupled to node B, its gate receiving a sum control signal SUM, and its drain providing an output signal $V_{out}$. NMOS transistor 660 corresponds to switch 560 in FIG. 5A. Capacitor 662 is coupled between the drain of NMOS transistor 660 and circuit ground.

In the exemplary design shown in FIG. 6, each section 640 includes M cells, with only one cell in section 640o being labeled as cell 650. Each cell includes a capacitor 652 and NMOS transistors 654, 656 and 658. NMOS transistor 654 has its drain coupled to the section input (which is node A), its gate receiving a load signal $L_n$, and its source coupled to a first end of capacitor 652, where $n \in \{0, \ldots, N\}$. A second end of capacitor 652 is coupled to circuit ground. NMOS transistor 656 has its drain coupled to the section output (which is node B), its gate receiving a select signal $S_{nm}$ for the cell, and its source coupled to the first end of capacitor 652, where $m \in \{1, \ldots, M\}$. NMOS transistor 658 has its drain coupled to the first end of capacitor 652, its gate receiving a reset signal $R_n$ for the section, and its source coupled circuit ground. NMOS transistor 654 is a charge switch used to charge capacitor 652 and may correspond to switch 554 in FIG. 5A. NMOS transistor 656 is a select switch used to couple capacitor 652 to summing node B and may correspond to switch 556 in FIG. 5A. NMOS transistor 658 is a reset switch used to reset capacitor 652 to a predetermined value (e.g., 0V) prior to a charge operation and may correspond to switch 558 in FIG. 5A.

In the exemplary design shown in FIG. 6, each section 640 has one load signal $L_n$ that is coupled to the gates of all M NMOS transistors 654 in that section. The load signal controls the charging of the M capacitors 652 in the section. The N+1 sections 640a through 640o have N+1 different load signals $L_0$ through $L_N$, respectively, that operate as described below. Each section 640 has one reset signal $R_n$ that is coupled to the gates of all M NMOS transistors 658 in that section. The reset signal controls the resetting of the M capacitors 652 in the section. Each section 640 also has a set of M select signals $S_{n1}$ through $S_{nM}$ that is coupled to the gates of the M NMOS transistors 656 in that section. The select signals control the coupling of the M capacitors 652 in the section to node B.

In general, N and M may each be any integer value. Analog FIR filter 630 may be operated as a decimating rectangular filter, a non-decimating rectangular filter, a decimating weighted filter, or a non-decimating weighted filter by generating appropriate control signals for NMOS transistors 654, 656 and 660.

Figure 7:
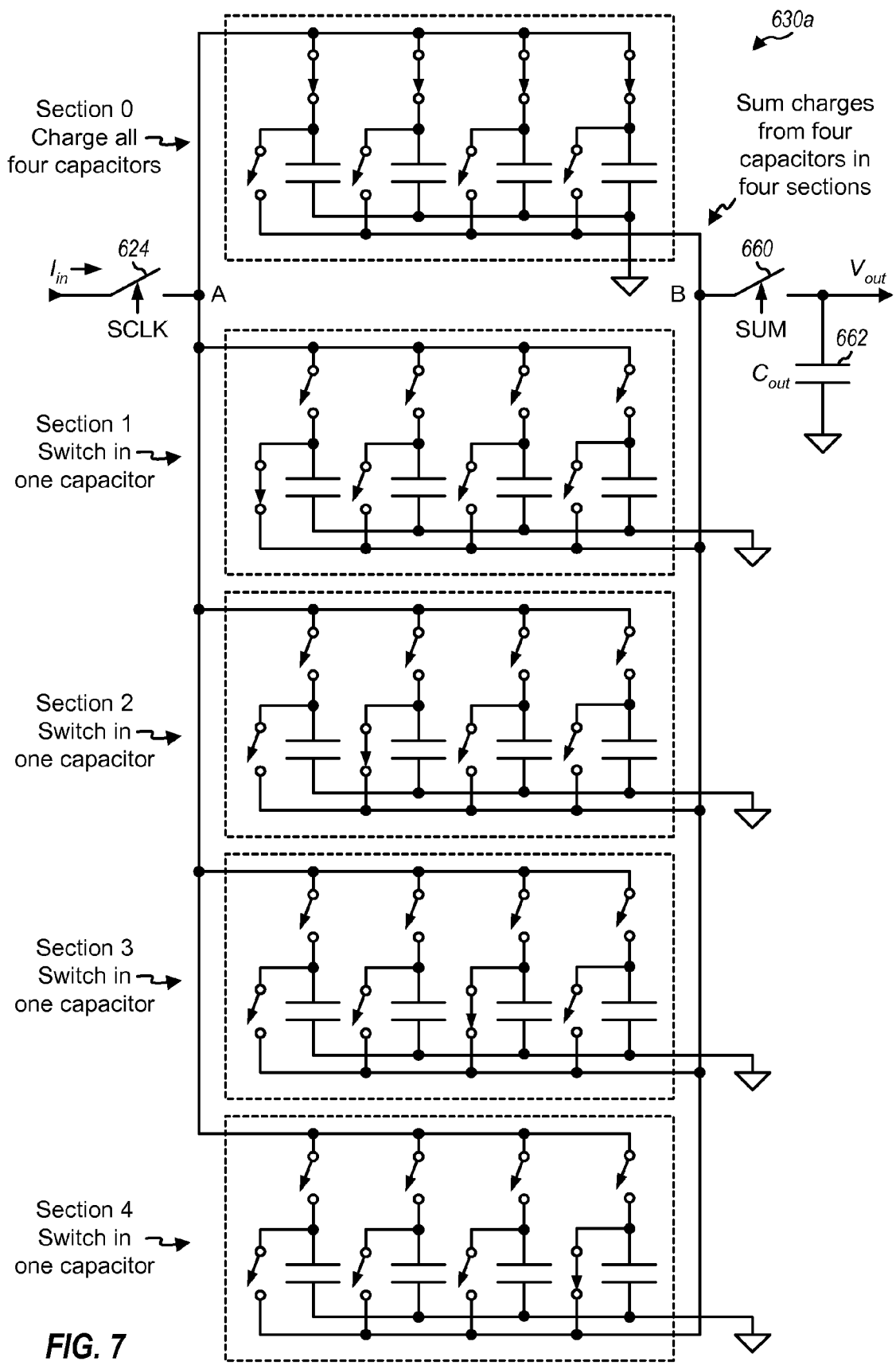
FIG. 7 shows a 4-tap non-decimating rectangular FIR filter.

FIG. 7 shows a schematic diagram of a 4-tap non-decimating rectangular FIR filter 630a, which is one exemplary design of analog FIR filter 630 in FIG. 6. In this exemplary design, analog FIR filter 630a includes five sections 0 through 4, each section includes four cells, and each cell has one unit capacitor. In each sampling clock period, the current $I_{in}$ is passed through switch 624 to a different section and charges all four capacitors in that section. The four capacitors are charged at the same time in one clock period and store the analog sample. The five sections are charged in a round robin manner in five consecutive clock periods, one section per clock period.

In each clock period, the four sections that are not being charged provide their stored charges to node B, one capacitor per section. The charges from four capacitors in the four sections are provided via switch 660 to capacitor 662 to generate an output sample for the clock period. Each section includes four capacitors and can provide the charges from the four capacitors in four clock periods, one capacitor per clock period. This allows one output sample to be generated in each clock period.

Table 2 shows the operation of the five sections 0 through 4 in FIG. 7. In clock period $T_0$, the four capacitors $C_{01}$ through $C_{04}$ in section 0 are charged to the same value denoted as x(0). The charge from a different capacitor in section 0 is provided to summing node B in each of the next four clock periods $T_1$ through $T_4$. In clock period $T_1$, the four capacitors $C_{11}$ through $C_{14}$ in section 1 are charged to the same value denoted as x(1). The charge from a different capacitor in section 1 is provided to summing node B in each of the next four clock periods $T_2$ through $T_5$. In clock period $T_2$, the four capacitors $C_{21}$ through $C_{24}$ in section 2 are charged to the same value denoted as x(2). In clock period $T_3$, the four capacitors $C_{31}$ through $C_{34}$ in section 3 are charged to the same value denoted as x(3). In clock period $T_4$, the four capacitors $C_{41}$ through $C_{44}$ in section 4 are charged to the same value denoted as x(4). The charges on capacitors $C_{04}$, $C_{13}$, $C_{22}$ and $C_{31}$ in sections 0 through 3 are provided to capacitor 562 to generate an output sample, which may be given as y(4)=x(0)+x(1)+x(2)+x(3). In clock period $T_5$, the four capacitors $C_{01}$ through $C_{04}$ in section 0 are again charged to the same value denoted as x(5). The charges on capacitors $C_{14}$, $C_{23}$, $C_{32}$ and $C_{41}$ in sections 0 through 3 are provided to capacitor 562 to generate an output sample, which may be given as y(5)=x(1)+x(2)+x(3)+x(4). The same operation occurs for each subsequent clock period.

TABLE 2

| Clock Period | Section 0 | Section 1 | Section 2 | Section 3 | Section 4 | Output sum charges on |
|---|---|---|---|---|---|---|
| $T_0$ | Charge $C_{01}$, $C_{02}$, $C_{03}$, $C_{04}$ | Provide $C_{14}$ | Provide $C_{23}$ | Provide $C_{32}$ | Provide $C_{41}$ | $C_{14}$, $C_{23}$, $C_{32}$ & $C_{41}$ |
| $T_1$ | Provide $C_{01}$ | Charge $C_{11}$, $C_{12}$, $C_{13}$, $C_{14}$ | Provide $C_{24}$ | Provide $C_{33}$ | Provide $C_{42}$ | $C_{01}$, $C_{24}$, $C_{33}$ & $C_{42}$ |
| $T_2$ | Provide $C_{02}$ | Provide $C_{11}$ | Charge $C_{21}$, $C_{22}$, $C_{23}$, $C_{24}$ | Provide $C_{34}$ | Provide $C_{43}$ | $C_{02}$, $C_{11}$, $C_{34}$ & $C_{43}$ |
| $T_3$ | Provide $C_{03}$ | Provide $C_{12}$ | Provide $C_{21}$ | Charge $C_{31}$, $C_{32}$, $C_{33}$, $C_{34}$ | Provide $C_{44}$ | $C_{03}$, $C_{12}$, $C_{21}$ & $C_{44}$ |
| $T_4$ | Provide $C_{04}$ | Provide $C_{13}$ | Provide $C_{22}$ | Provide $C_{31}$ | Charge $C_{41}$, $C_{42}$, $C_{43}$, $C_{44}$ | $C_{04}$, $C_{13}$, $C_{22}$ & $C_{31}$ |
| $T_5$ | Charge $C_{01}$, $C_{02}$, $C_{03}$, $C_{04}$ | Provide $C_{14}$ | Provide $C_{23}$ | Provide $C_{32}$ | Provide $C_{41}$ | $C_{14}$, $C_{23}$, $C_{32}$ & $C_{41}$ |

As shown in Table 2, one output sample y(n) may be obtained in each clock period by storing four copies of each input sample x(n) in one section and providing one copy in each of the next four clock periods. In each clock period, four input samples for four prior clock periods may be obtained from four sections and summed to generate an output sample for that clock period. There is a propagation delay of one clock period, and the output sample y(n) for the current clock period is generated based on the stored analog samples x(n−1) through x(n−4) for four prior clock periods.

Analog FIR filter 630 in FIG. 6 may also be used for a weighted FIR filter. In this case, N sections may be used to implement an N-tap weighted FIR filter. All M capacitors in each section may be charged in one clock period, and all or a subset of the M capacitors may be selected based on the weight for that section. After all N sections have been charged in N clock periods, the charges from all selected capacitors in the N sections may be summed to generate one output sample. One output sample is thus generated in every N clock periods, and the decimation rate is N.

For a weighted FIR filter, the same number of capacitors (or the same total capacitance) in each section should be coupled to node B in order to obtain proper voltage scaling. This may be achieved by charging all M capacitors in each section, resetting unused capacitors to zero charge, and switching in all M capacitors to node B.

Figure 8:
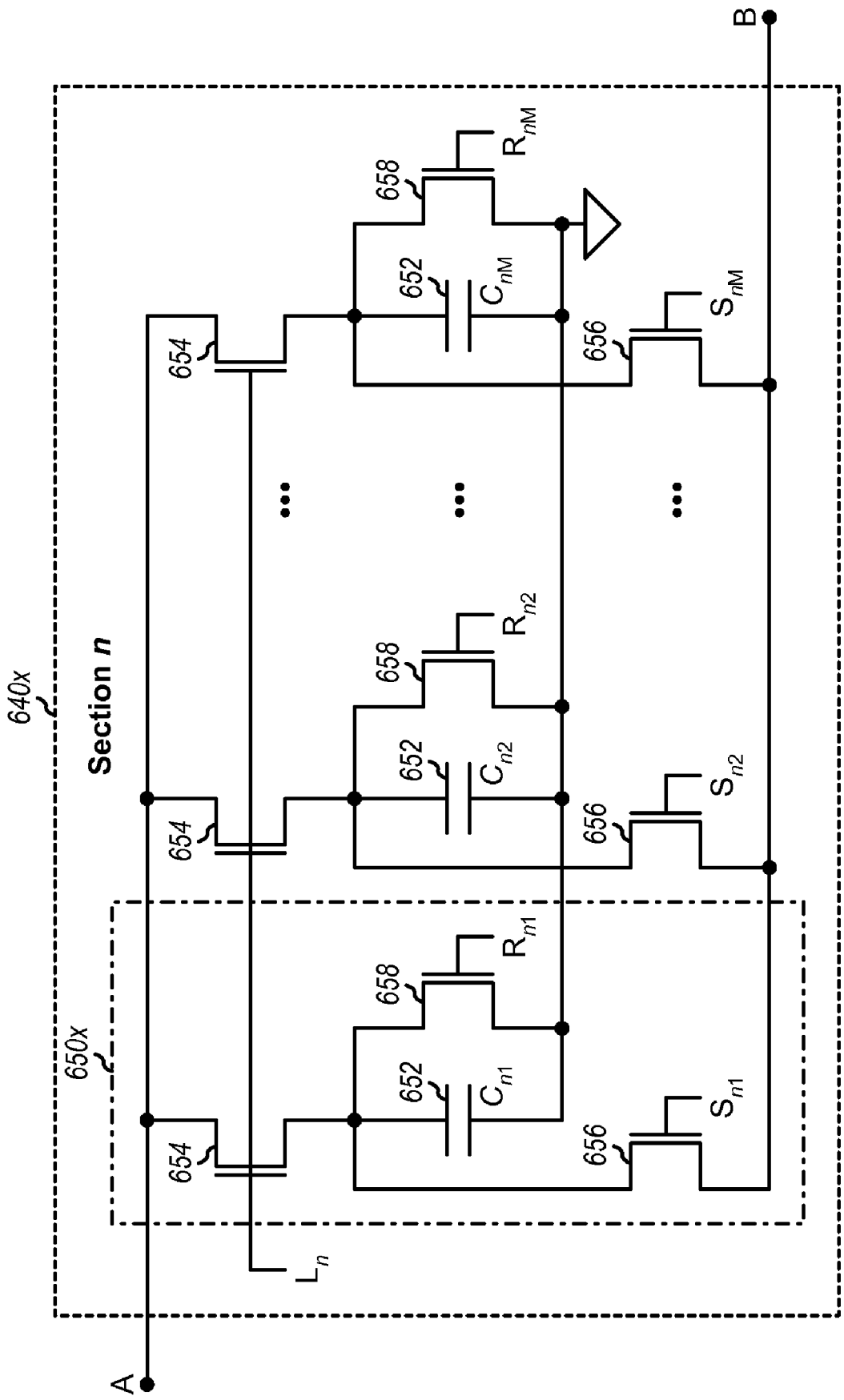
FIG. 8 shows a section of cells.

FIG. 8 shows a schematic diagram of an exemplary design of a section 640x of cells with a reset switch for each cell. Section 640x may be used for each of sections 640a through 640o in analog FIR filter 630 in FIG. 6. Section 640x includes M cells, with only one cell being labeled as cell 650x. Each cell includes capacitor 652 and NMOS transistors 654, 656 and 658 that are coupled as described above for FIG. 6. NMOS transistor 658 for each cell receives a reset signal $R_{nm}$ for that cell. For each cell, capacitor 652 may be charged via NMOS transistor 654 and may thereafter be reset to zero charge (as shown in FIG. 8) or to a predetermined value (not shown in FIG. 8) via NMOS transistor 658 if the weight is zero or if the capacitor is not selected for a weight of less than 1. Capacitor 652 may store either the original charge or zero charge or a predetermined value and may be switched to node B via NMOS transistor 656.

Figure 9:
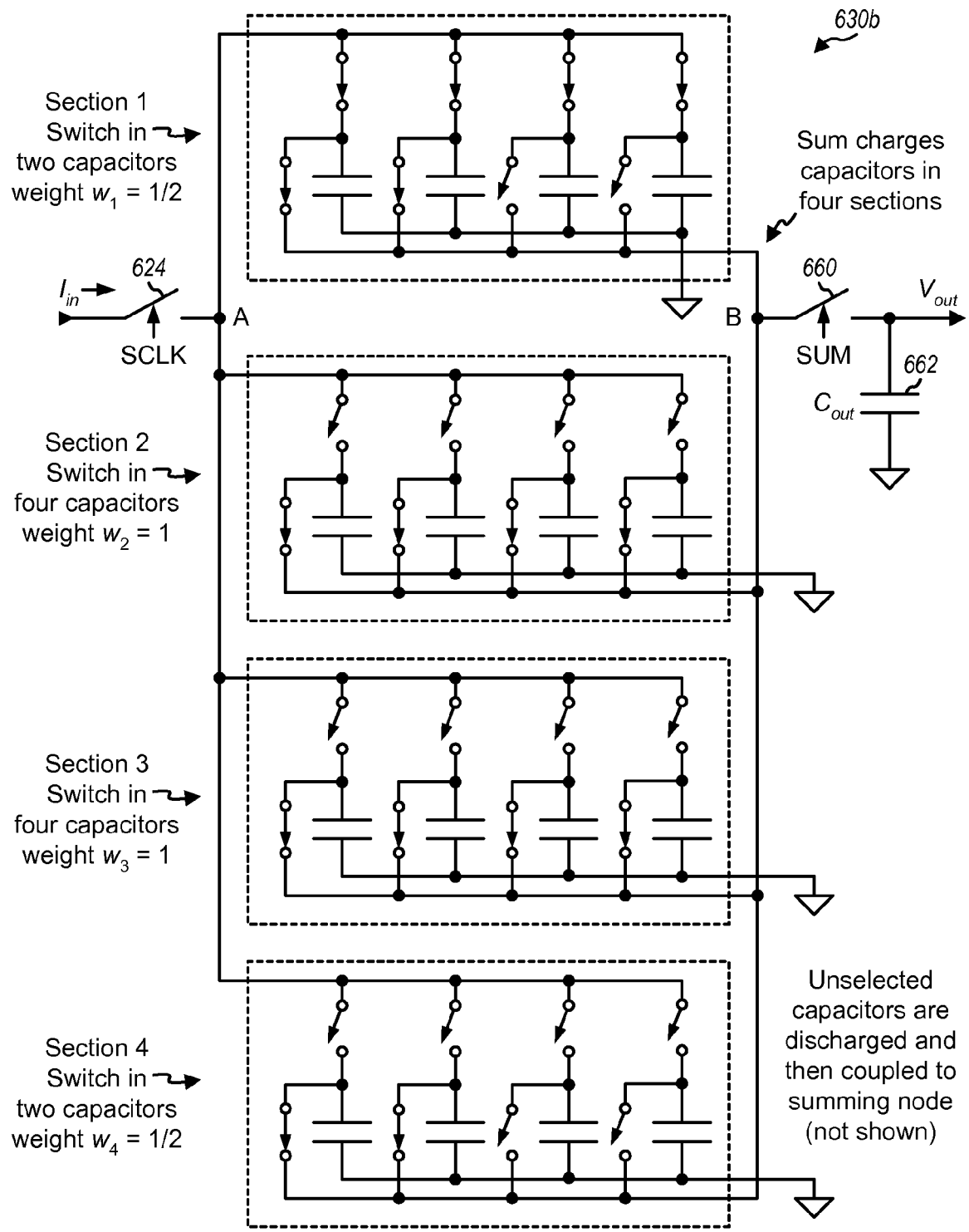
FIG. 9 shows a 4-tap decimating weighted FIR filter.

FIG. 9 shows a schematic diagram of a 4-tap decimating weighted FIR filter 630b, which is another exemplary design of analog FIR filter 630 in FIG. 6. In this exemplary design, analog FIR filter 630b includes four sections 1 through 4, each section includes four cells, and each cell has one unit capacitor. In each sampling clock period, the current $I_{in}$ is passed through switch 624 to a different section and charges all four capacitors in that section. The four sections are charged in a round robin manner in four consecutive clock periods, one section per clock period. For each section, all four capacitors are initially charged when the section is charged, and the unused capacitors in the section are thereafter discharged by shorting the associated reset switches (not shown in FIG. 9).

After all four sections have been charged, the four capacitors in each section are coupled to node B. For example, a 4-tap FIR filter with weights of $w_1=w_4=\frac{1}{2}$ and $w_2=w_3=1$ may be obtained by switching in two charged capacitors and two discharged capacitors in section 1, four charged capacitors in section 2, four charged capacitors in section 3, and two charged capacitors and two discharged capacitors in section 4. In general, the number of unit capacitors in each section may determine the granularity or resolution of the weight for that section. M unit capacitors may be used to obtain a weight with granularity of 1/M, or quantized in steps of 1/M.

The four sections are charged in four clock periods, and the charges from all capacitors are summed to generate one output sample. One output sample is thus generated in every four clock periods, and the decimation rate is four.

In general, the weight $w_n$ for each section n may be determined by the number of capacitors with charge versus the number of capacitors without charge (or zeroed out). If each section includes M unit capacitors, then the total capacitance $C_n$ for each section n may be expressed as:

$$C_n = \sum_{m=1}^{M} C_{nm}, \quad \text{Eq (4)}$$

where $C_{nm}$ is the capacitance of the m-th capacitor in section n.

The weight $w_n$ for each section n may be expressed as:

$$w_n = \frac{\sum_{m=1}^{K} C_{nm}}{C_n}, \quad \text{Eq. (5)}$$

where K is the number of capacitors with charge and M−K is the number of capacitors without charge. Different weights may be obtained for different sections based on the number of capacitors that are charged for each section. The FIR filter impulse response may be determined by the weights for all N sections and given as $h=[w_1 \, w_2 \, \ldots \, w_N]$.

Figure 10:
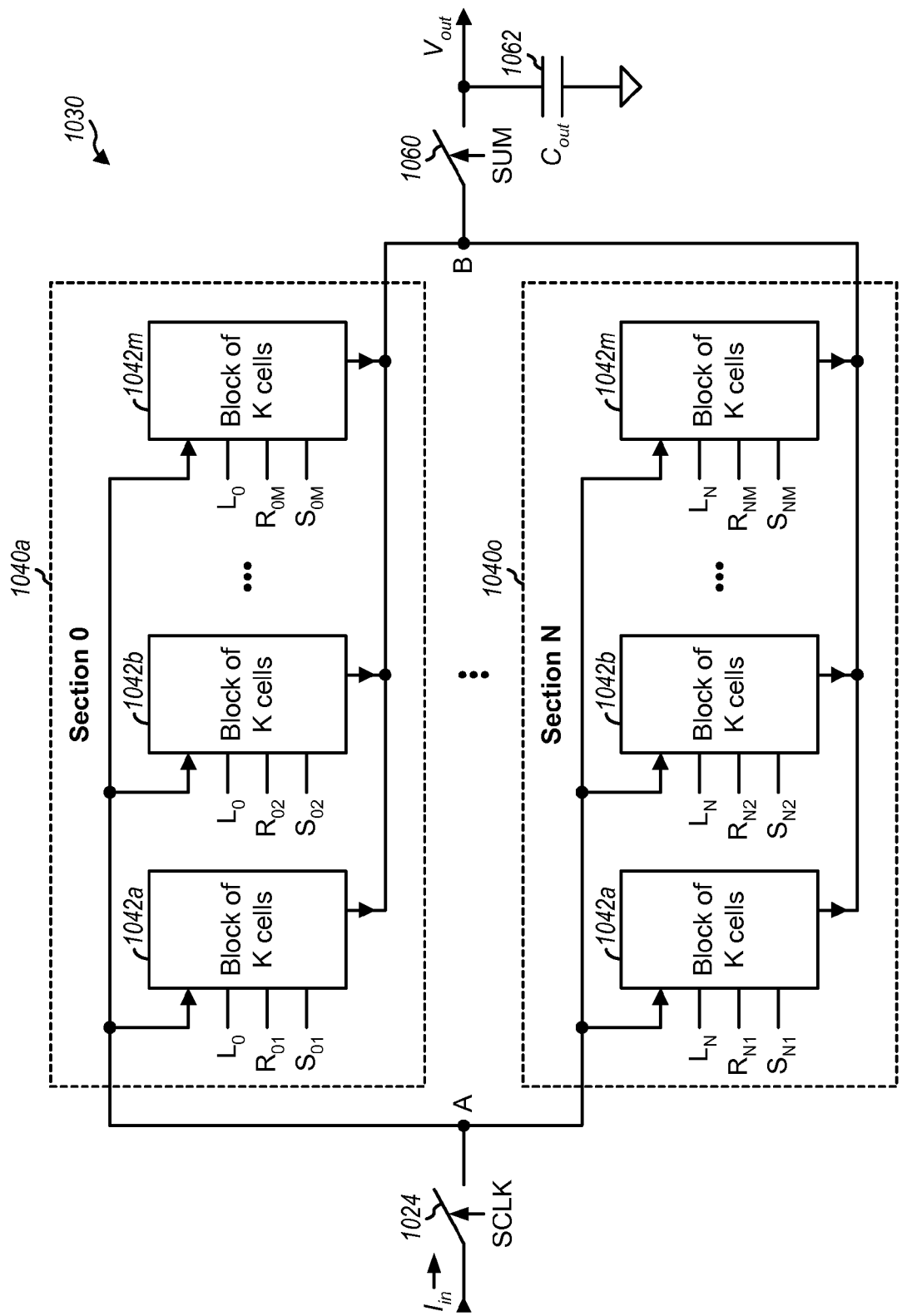
FIG. 10 shows an N-tap analog FIR filter supporting different modes.

FIG. 10 shows a schematic diagram of an exemplary design of an N-tap analog FIR filter 1030, which is another exemplary design of FIR filter 430 using switched capacitors. Analog FIR filter 1030 may be used for discrete time analog filter 230 in FIG. 2. Switches 1024 and 1060, and a capacitor 1062 are coupled in the same manner as switches 624 and 660, and capacitor 662, respectively, in FIG. 6.

Analog FIR filter 1030 includes N+1 sections 1040a through 1040o, with each section including M blocks 1042a through 1042m. Each block 1042 has its input coupled to node A and its output coupled to node B. Each block 1042 includes K cells and may be implemented in similar manner as section 640 in FIG. 6, section 640x in FIG. 8, or with some other exemplary design. Each cell includes one unit capacitor. Each block 1042 may thus provide a configurable weight with granularity of 1/K.

Each section 1040 has one load signal $L_n$ that controls the charging of the capacitors in the section. The N+1 sections 1040a through 1040o have N+1 different load signals $L_0$ through $L_N$, respectively, which operate as described above for FIG. 6. Each section 1040 also has a set of M select signals $S_{n1}$ through $S_{nM}$ that is coupled to M blocks 1042a through 1042m, respectively. The select signals control the coupling of the capacitors in blocks 1042a through 1042m to node B. Each section 1040 further has a set of M reset signals $R_{n1}$ through $R_{nM}$ that is coupled to M blocks 1042a through 1042m, respectively. The reset signals control the discharging of unselected capacitors in blocks 1042a through 1042m to obtain zero charge.

The N+1 sections 1040a through 1040o are charged in a round robin manner in N+1 clock periods, one section in each clock period. For section 1040a, all capacitors in the section are charged at the same time in one clock period and have the same value initially. For each block in section 1040a, the unused capacitors are discharged or shorted via the associated reset NMOS transistors. The M blocks are thereafter coupled to node B in M subsequent clock periods, one block per clock period. For each block that is coupled to node B, all charged and discharged capacitors in that block are coupled to node B via the select NMOS transistors.

Figure 11:
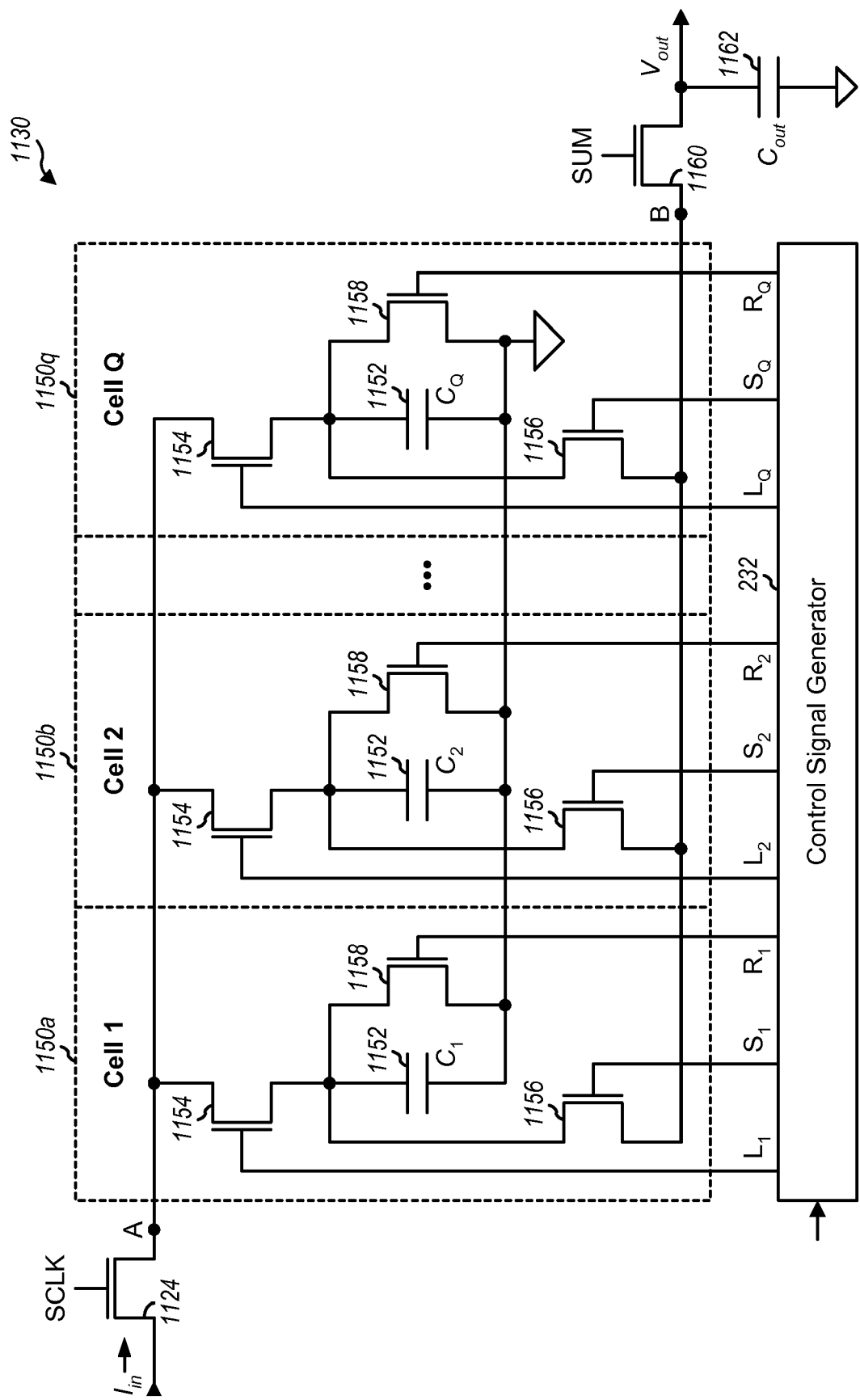
FIG. 11 shows a generalized analog FIR filter supporting different modes.

FIG. 11 shows a schematic diagram of an exemplary design of a generalized analog FIR filter 1130, which is yet another exemplary design of FIR filter 430 using switched capacitors. Analog FIR filter 1130 can implement all of the modes shown in Table 1 and may be used for discrete time analog filter 230 in FIG. 2. NMOS transistors 1124 and 1160, and a capacitor 1162 are coupled in the same manner as NMOS transistors 624 and 660, and capacitor 662, respectively, in FIG. 6.

Analog FIR filter 1130 includes Q cells 1150a through 1150q, where Q may be any suitable value. Each cell includes a capacitor 1152 and NMOS transistors 1154, 1156 and 1158 that are coupled as described above for cell 650x in FIG. 8. Each cell may have its own load signal $L_q$, select signal $S_q$, and reset signal $R_q$, for $q \in \{1, \ldots, Q\}$. Control signal generator 232 may generate the control signals for the NMOS transistors in analog FIR filter 1130.

In general, a sufficient number of cells (Q) may be used to implement a desired analog FIR filter of any number of taps and characteristics. A non-decimating rectangular filter may be obtained by charging multiple capacitors in parallel and switching in one capacitor at a time. A decimating weighted filter may be obtained by charging multiple capacitors in parallel and switching in all or a subset of these capacitors at the same time based on the desired weight. A non-decimating weighted filter may be obtained by charging multiple sets of capacitors in parallel and switching in one set of capacitors at a time. Zero or more capacitors in each set may be selected based on the desired weight.

Table 3 lists some configurations that may be achieved with analog FIR filter 1130 for an exemplary design with 80 unit capacitors, or Q=80. In general, different FIR filter architectures, weight values, and decimation rates may be obtained by appropriately controlling the load, select, and reset signals for the Q cells in analog FIR filter 1130. The FIR filter architectures, weight values, and/or decimation rates may also be changed dynamically.

TABLE 3

| Decimating rectangular FIR filter | Non-decimating rectangular FIR filter | Decimating weighted FIR filter | Non-decimating weighted FIR filter |
|---|---|---|---|
| N = 80 | N = 8 | N = 8 | N = 4 |
| 80 sections | 9 sections | 8 sections | 5 sections |
| — | — | — | 4 blocks/section |
| 1 cap/section | 8 caps/section | 10 caps/section | 4 caps/block |
| Decimate by 80 | Decimate by 1 | Decimate by 8 | Decimate by 1 |
| $w_n \in \{0, 1\}$ | $w_n \in \{0, 1\}$ | $\{0, 0.1, 0.2, \ldots, 1\}$ | $\{0, \frac{1}{4}, \frac{1}{2}, \frac{3}{4}, 1\}$ |
| 80 total caps | 72 total caps | 80 total caps | 80 total caps |

The analog FIR filter may be operated as a multi-rate filter that can support different decimation rates, e.g., 1, 2, 4, etc. The decimation rate may be selected based on the characteristics and/or bandwidth of the signal being processed. For example, different decimation rates may be used for different radio technologies, different system bandwidths, etc.

For clarity, much of the description above assumes the use of unit/equal capacitors for the analog FIR filter, which is also referred to as thermometer decoding. The use of unit capacitors may improve capacitor matching. Non-equal capacitors such as binary-weighted capacitors may also be used for the analog FIR filter.

FIGS. 5 through 11 show some exemplary single-ended designs of the analog FIR filter. The analog FIR filter may also be implemented with differential designs, which may support both positive and negative weights.

Figure 12A:
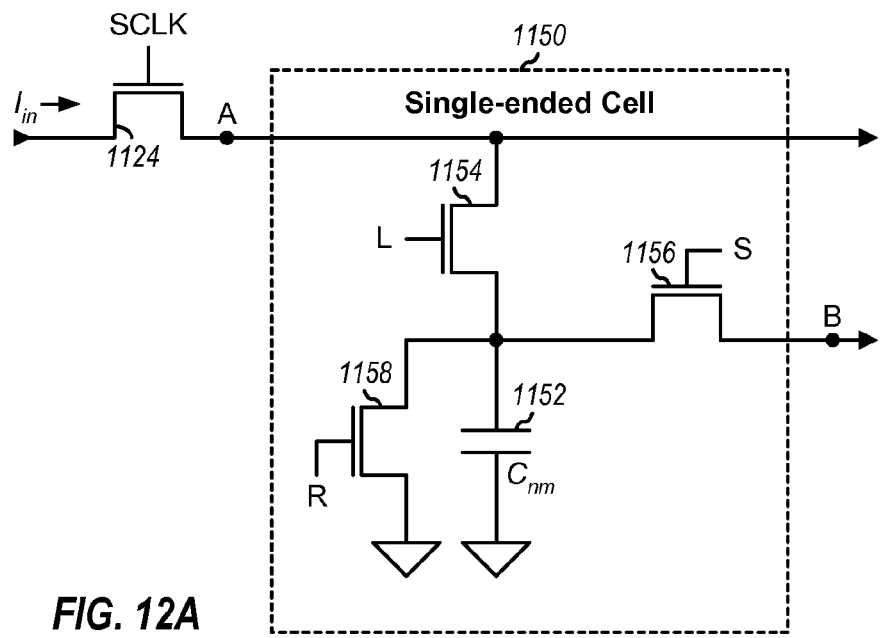
FIG. 12A shows a single-ended analog FIR filter.

FIG. 12A shows a portion of analog FIR filter 1130 in FIG. 11, which is used for comparison against a differential design. FIG. 12A shows pass NMOS transistor 1124, and one single-ended cell 1150. NMOS transistors 1156 and 1158 in cell 1150 have been re-arranged in FIG. 12A from their original locations in FIG. 11.

Figure 12B:
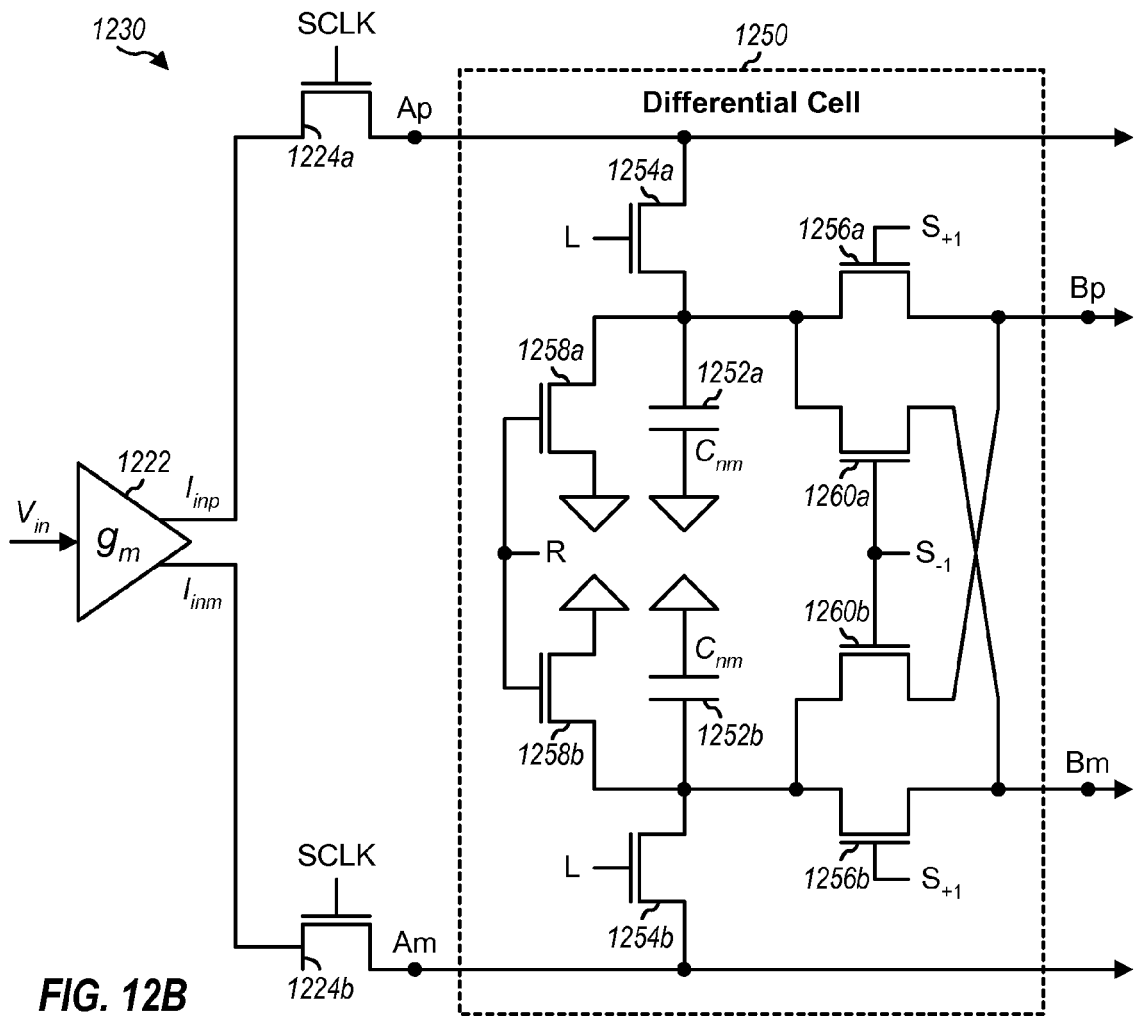
FIG. 12B shows a differential analog FIR filter.

FIG. 12B shows a schematic diagram of an exemplary design of a differential analog FIR filter 1230. A transconductance amplifier 1222 receives an input signal $V_{in}$ and provides a differential current signal $I_{inp}$ and $I_{inm}$. NMOS transistors 1224a and 1224b have their source coupled to the differential output of amplifier 1222, their gates receiving the sampling clock SCLK, and their drains coupled to nodes Ap and Am, respectively.

For simplicity, FIG. 12B shows only one differential cell 1250. Within cell 1250, a capacitor 1252a and NMOS transistors 1254a, 1256a and 1258a are coupled in the same manner as capacitor 1152 and NMOS transistors 1154, 1156 and 1158, respectively, in cell 1150 in FIG. 12A. The drain of NMOS transistor 1254a is coupled to node Ap, and the drain of NMOS transistor 1256a is coupled to a summing node Bp. Similarly, a capacitor 1252b and NMOS transistors 1254b, 1256b and 1258b are coupled in the same manner as capacitor 1152 and NMOS transistors 1154, 1156 and 1158 in cell 1150 in FIG. 12A. However, the drain of NMOS transistor 1254b is coupled to node Am, and the drain of NMOS transistor 1256b is coupled to a summing node Bm. Cell 1250 further includes NMOS transistors 1260a and 1260b, which have their sources coupled to the sources of NMOS transistors 1256a and 1256b, respectively, their gates coupled together, and their drains coupled to nodes Bm and Bp, respectively.

Cell 1250 receives a differential current signal and stores a differential analog sample. Cell 1250 may be operated to obtain a weight of 0, +1 or −1. A weight of 0 may be obtained by shorting capacitors 1252a and 1252b via NMOS transistors 1258a and 1258b, respectively. A weight of +1 may be obtained by coupling capacitors 1252a and 1252b via NMOS transistors 1256a and 1256b to nodes Bp and Bm, respectively. A weight of −1 may be obtained by coupling capacitors 1252a and 1252b via NMOS transistors 1260a and 1260b to nodes Bm and Bp, respectively.

The discrete time analog filter described herein may be used for various applications such as communication, networking, computing, consumer electronics, etc. The discrete time analog filter may be used for cellular phones, wireless devices, handheld devices, wireless modems, broadcast receivers, PDAs, laptop computers, cordless phones, etc. The discrete time analog filter may also be used for various communication systems such as CDMA2000 systems, Wideband-CDMA (W-CDMA) systems, Global System for Mobile Communications (GSM) systems, wireless local area networks (WLANs), broadcast systems, etc. The discrete time analog filter may also be used for Bluetooth devices, Global Positioning System (GPS) and satellite positioning system (SPS) receivers, etc.

The discrete time analog filter described herein may be implemented within an IC, an RFIC, a mixed-signal IC, an ASIC, a printed circuit board (PCB), an electronics device, etc. The discrete time analog filter may also be fabricated with various IC process technologies such as CMOS, N-channel MOS (NMOS), P-channel MOS (PMOS), bipolar junction transistor (BJT), bipolar-CMOS (BiCMOS), silicon germanium (SiGe), gallium arsenide (GaAs), etc.

An apparatus implementing the discrete time analog filter described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality.

Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a sampler configured to sample an analog signal and provide analog samples at a sampling rate; and
   a discrete time analog filter configured to filter the analog samples and provide filtered analog samples at the sampling rate, the discrete time analog filter comprising a plurality of sections, each section comprising multiple capacitors for multiple sample periods, wherein for each section not being charged, one capacitor of the multiple capacitors is coupled to a summing mode for each sample period.

2. The apparatus of claim 1, wherein the discrete time analog filter comprises
   a plurality of capacitors configured to store analog samples for a plurality of sample periods, and
   a summer configured to sum the stored analog samples from the plurality of capacitors to generate the filtered analog samples.

3. The apparatus of claim 2, wherein the discrete time analog filter further comprises a plurality of switches coupled to the plurality of capacitors, each switch configured to reset an associated capacitor to a predetermined value prior to the capacitor being charged to store an analog sample.

4. The apparatus of claim 1, wherein the discrete time analog filter is configured to implement a finite impulse response (FIR) filter with N equal weights for N filter taps, where N is greater than one.

5. The apparatus of claim 1, wherein the discrete time analog filter is configured to implement a finite impulse response (FIR) filter with N weights having at least two different values for N filter taps, where N is greater than one.

6. The apparatus of claim 1, wherein each capacitor is configured to store an analog sample for one filter tap for one sample period.

7. The apparatus of claim 1, wherein the plurality of sections are charged in a plurality of sample periods, one section in each sample period, and wherein the multiple capacitors in each section are charged to a value for one analog sample when the section is charged.

8. The apparatus of claim 1, wherein the discrete time analog filter comprises a plurality of cells coupled to the sampler, each cell comprising a capacitor configured to store one analog sample.

9. The apparatus of claim 8, wherein each cell further comprises
   a first switch configured to couple the capacitor in the cell to the sampler when the first switch is closed, and
   a second switch configured to couple the capacitor in the cell to a summing node when the second switch is closed.

10. The apparatus of claim 9, wherein each cell further comprises
    a third switch configured to discharge the capacitor in the cell when the third switch is closed.

11. The apparatus of claim 9, wherein the first and second switches for each cell are closed based on first and second control signals, respectively, for the cell.

12. The apparatus of claim 9, wherein the first and second switches for each cell are implemented with metal oxide semiconductor (MOS) transistors.

13. The apparatus of claim 8, wherein each cell is configured to provide a positive weight, a negative weight, or a zero weight.

14. The apparatus of claim 1, further comprising:
a transconductance amplifier configured to amplify a voltage input signal and provide a current signal as the analog signal for the sampler.

15. An apparatus comprising:
a sampler configured to sample an analog signal and provide analog samples at a sampling rate; and
a discrete time analog filter configured to filter the analog samples and provide filtered analog samples at the sampling rate, wherein the discrete time analog filter comprises a plurality of cells coupled to the sampler, each cell comprising a capacitor configured to store one analog sample and each cell is configured to receive a differential current signal and store one differential analog sample.

16. An apparatus comprising:
a sampler configured to sample an analog signal and provide analog samples at a sampling rate; and
a discrete time analog filter configured to filter the analog samples and provide filtered analog samples at the sampling rate; and
an input capacitor coupled to the sampler and configured to provide the analog signal for the sampler.

17. An apparatus comprising:
a sampler configured to sample an analog signal and provide analog samples at a sampling rate; and
a discrete time analog filter configured to filter the analog samples with at least two different weights and provide filtered analog samples, wherein the discrete time analog filter comprises a plurality of sections for a plurality of filter taps, wherein a weight for each filter tap is determined based on zero or more selected capacitors in an associated section of the filter tap.

18. The apparatus of claim 17, wherein the multiple capacitors in each section have equal size, and wherein the weight for each filter tap is determined based on the number of selected capacitors in the section for the filter tap.

19. The apparatus of claim 17, wherein the multiple capacitors in each section are reset to a predetermined value prior to the multiple capacitors being charged to store an analog sample.

20. The apparatus of claim 17, wherein the multiple capacitors in each section are charged in one sample period, unselected capacitors in the section are thereafter discharged, and the charged and discharged capacitors in the section are coupled to a summing node in a designated sample period.

21. The apparatus of claim 17, wherein the discrete time analog filter is configured to perform decimation and provide the filtered analog samples at an output rate lower than the sampling rate.

22. The apparatus of claim 17, wherein the discrete time analog filter is configured to provide the filtered analog samples at the sampling rate.

23. An apparatus comprising:
a sampler configured to sample an analog signal and provide analog samples at a sampling rate;
a discrete time analog filter operable in one of multiple modes and configured to filter the analog samples based on a selected mode and provide filtered analog samples, the discrete time analog filter comprising a plurality of capacitors being charged based on first control signals and coupled to a summing node based on second control signals, the discrete time analog filter further configured to provide the filtered analog samples at the sampling rate for a non-decimating mode and at less than the sampling rate for a decimating mode; and
a control signal generator configured to generate the first and second control signals based on the selected mode for the discrete time analog filter.

24. An apparatus comprising:
a sampler configured to sample an analog signal and provide analog samples at a sampling rate;
a discrete time analog filter operable in one of multiple modes and configured to filter the analog samples based on a selected mode and provide filtered analog samples, the discrete time analog filter comprising a plurality of capacitors being charged based on first control signals and coupled to a summing node based on second control signals; and
a control signal generator configured to generate the first and second control signals based on the selected mode for the discrete time analog filter, wherein the multiple modes comprise a rectangular mode and a weighted mode, and wherein the discrete time analog filter is configured to filter the analog samples based on equal weights for the rectangular mode and based on at least two different weights for the weighted mode.

25. An integrated circuit comprising:
a sampler configured to sample an analog signal and provide analog samples at a sampling rate; and
a discrete time analog filter configured to filter the analog samples and provide filtered analog samples, the discrete time analog filter comprising a plurality of sections for a plurality of filter taps, wherein for each section not being charged, one capacitor of a plurality of capacitors of each section is coupled to a summing node for each sampling period of a plurality of sampling periods.

26. The integrated circuit of claim 25, wherein the discrete time analog filter comprises
a plurality of capacitors configured to store analog samples for a plurality of sample periods, and
a summer configured to sum the stored analog samples from the plurality of capacitors to generate the filtered analog samples.

27. The integrated circuit of claim 25, wherein each capacitor is configured to store an analog sample for one filter tap for one sample period.

28. The integrated circuit of claim 27, wherein the plurality of sections are charged in a plurality of sample periods, one section in each sample period, and wherein the multiple capacitors in each section are charged to a value for one analog sample when the section is charged.

29. The apparatus of claim 28, wherein unselected capacitors in each section are discharged and the charged and discharged capacitors in the section are coupled to a summing node.

30. A method comprising:
sampling an analog signal to obtain analog samples at a sampling rate;
charging a plurality of sections of a discrete time analog filter with the analog signals in a plurality of sample periods, wherein one section is charged in each sample period;

coupling multiple capacitors in each section not being charged to a summing node in multiple sample periods, wherein one capacitor is coupled to the summing node in each sample period, and summing charges at the summing node to obtain filtered analog samples.

31. The method of claim 30, further comprising resetting the multiple capacitors in each section to a predetermined value prior to the charging the multiple capacitors in the section in one sample period.

32. The method of claim 30, further comprising:

selecting one of multiple modes for the discrete time analog filter; and generating control signals for switches within the discrete time analog filter based on the selected mode.

33. An apparatus comprising:

means for sampling an analog signal to obtain analog samples at a sampling rate;

means for charging a plurality of sections of the discrete time analog filter in a plurality of sample periods, wherein one section is charged in each sample period;

means for coupling multiple capacitors in each section not being charged to a summing node in multiple sample periods, wherein one capacitor is coupled to the summing node during each sample period; and means for summing charges at the summing node to obtain the filtered analog samples.

34. The apparatus of claim 33, further comprising:

means for selecting one of multiple modes for the discrete time analog filter; and means for generating control signals for switches within the discrete time analog filter based on the selected mode.

* * * * *